United States Patent [19]

Imai

[11] Patent Number: 5,404,336

[45] Date of Patent: Apr. 4, 1995

[54] SEMICONDUCTOR MEMORY DEVICE

[75] Inventor: Kimimasa Imai, Kawasaki, Japan

[73] Assignee: Kabushiki Kaisha Toshiba, Kawasaki, Japan

[21] Appl. No.: 121,906

[22] Filed: Sep. 16, 1993

[30] Foreign Application Priority Data

Sep. 22, 1992 [JP] Japan .................................. 4-253150

[51] Int. Cl.$^6$ ............................................. G11C 13/00
[52] U.S. Cl. ............................... 365/230.03; 365/200; 371/49.1; 371/49.3
[58] Field of Search ............ 365/63, 200, 201, 230.03; 371/49.1, 49.3, 50.1, 51.1

[56] References Cited

U.S. PATENT DOCUMENTS

| | | | |
|---|---|---|---|
| 4,660,174 | 4/1987 | Takemae et al. | 365/63 |
| 4,679,196 | 7/1987 | Tsujimoto | 371/51.1 |
| 5,089,993 | 2/1992 | Neal et al. | 365/230.03 |
| 5,152,492 | 8/1992 | Shimizu et al. | 365/51 |

OTHER PUBLICATIONS

Nakano et al., "A Sub-100 ns 256K DRAM with Open Bit Line Scheme", IEEE Journal of Solid-State Circuits, vol. SC-18, No. 5, Oct. 1983, pp. 452-456.

*Primary Examiner*—Terrell W. Fears
*Assistant Examiner*—F. Niranjan
*Attorney, Agent, or Firm*—Banner, Birch, McKie & Beckett

[57] ABSTRACT

The parity cell arrays are placed between the ordinary cell arrays and a second peripheral circuit. Data signal lines are provided between the ordinary cell arrays, between the ordinary cell arrays and the parity cell arrays, and between the parity cell arrays. These data signal lines are connected to read-write lines via data signal-line amplifier circuits. These data column-line amplifier circuits have almost the same construction. The data signal-line control circuit activates the data signal-line amplifier circuits during a write and a read operation to enable data transfer between the data signal lines and the read-write lines.

26 Claims, 21 Drawing Sheets

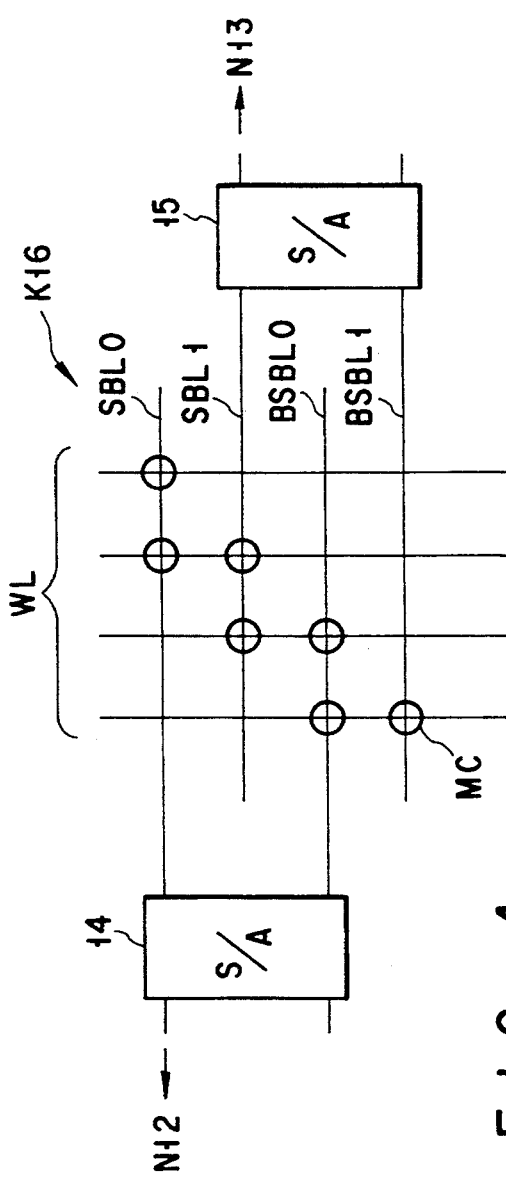
F I G. 4
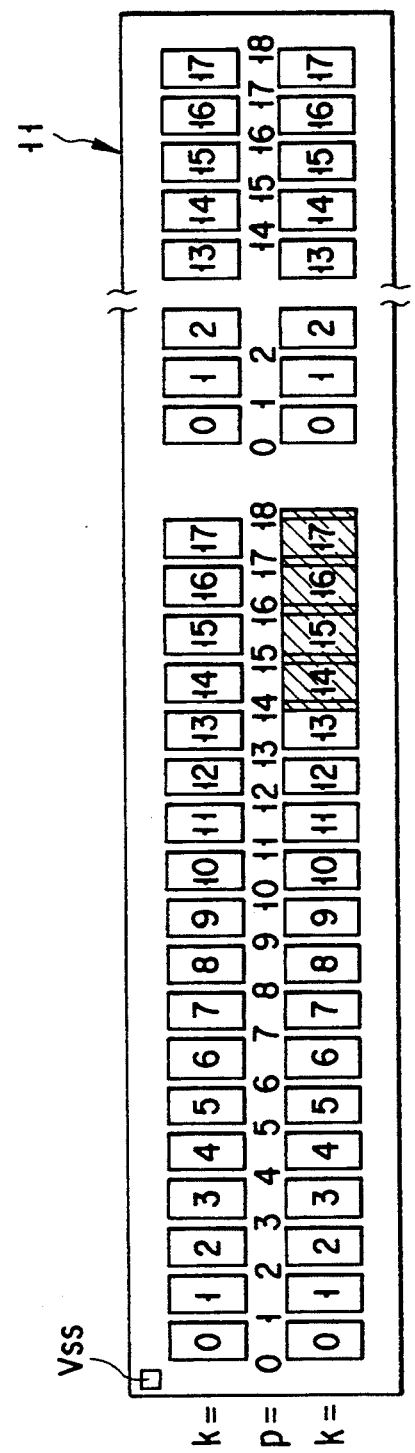
F I G. 5

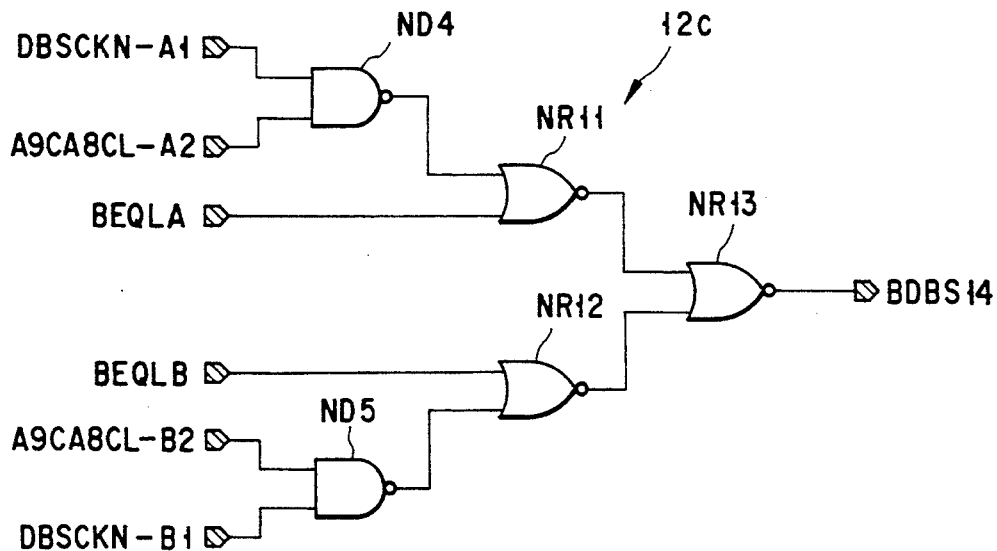
F I G. 7
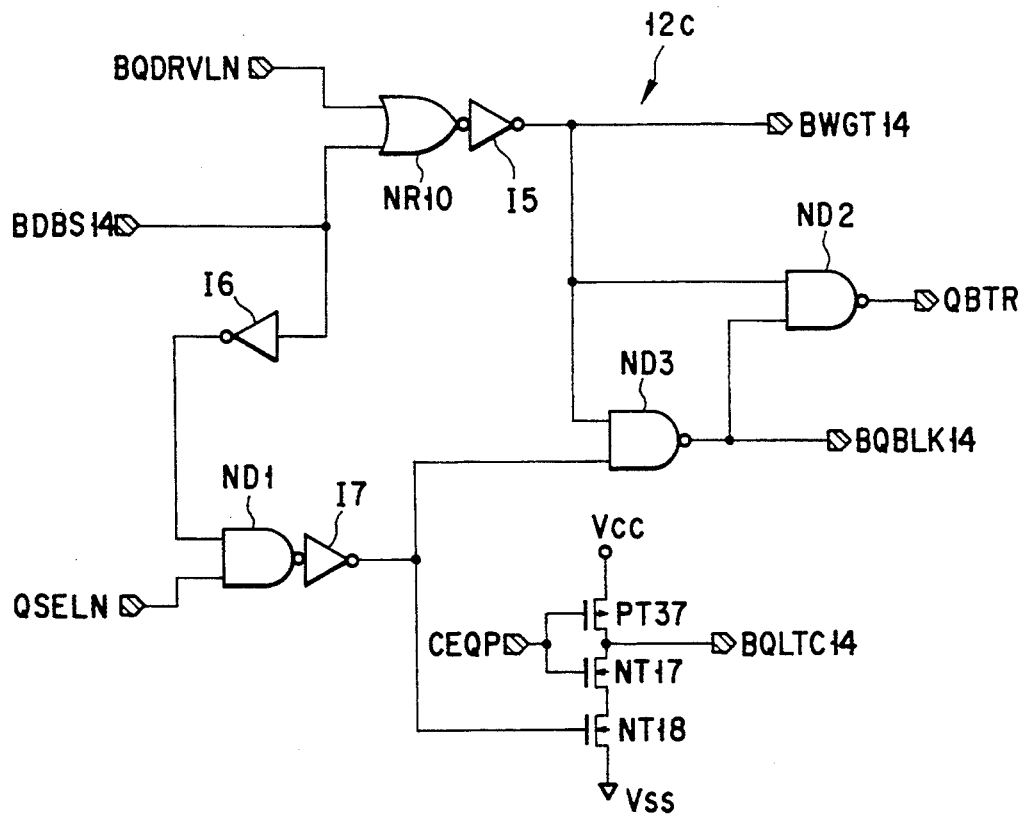
F I G. 8

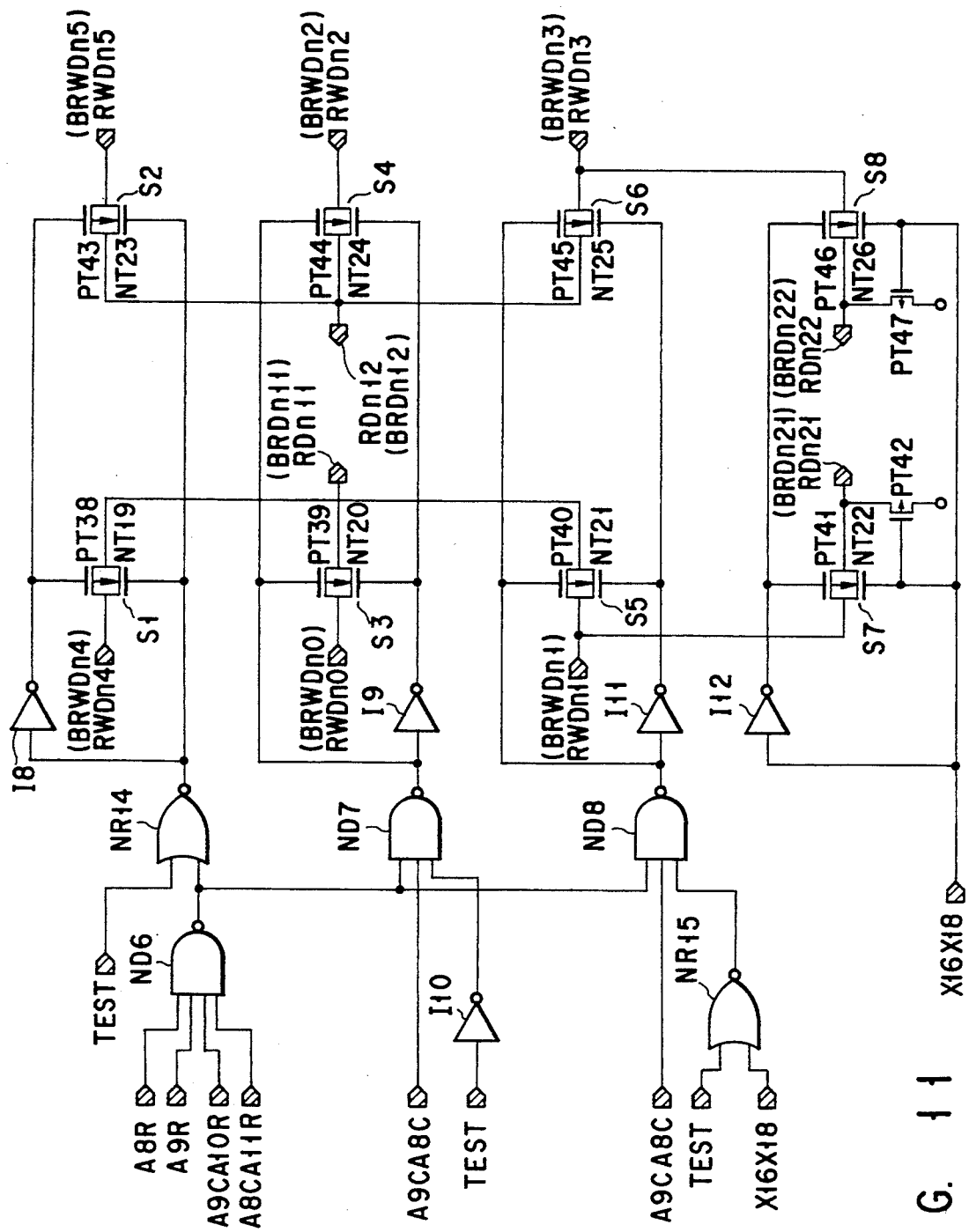
F I G. 11

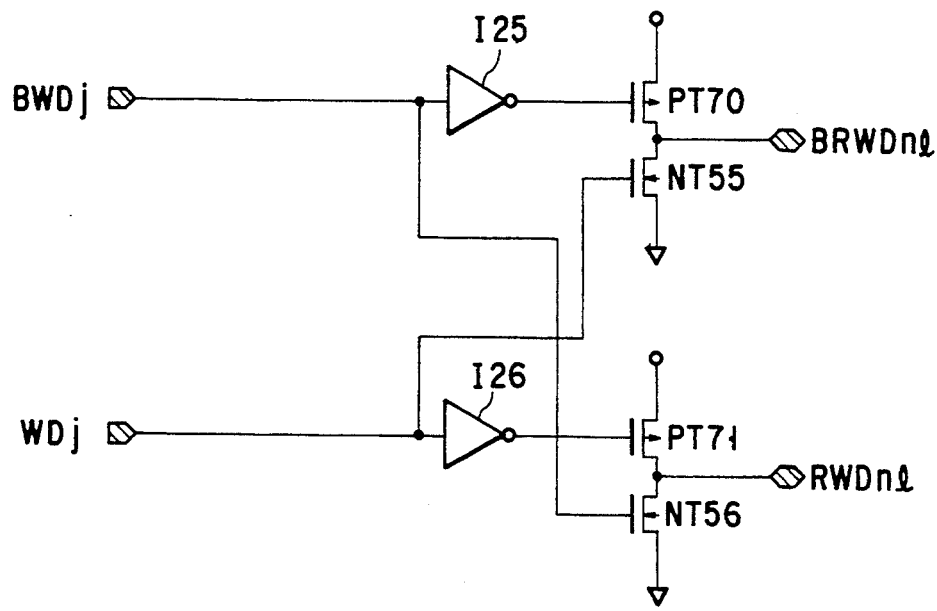
F I G. 15
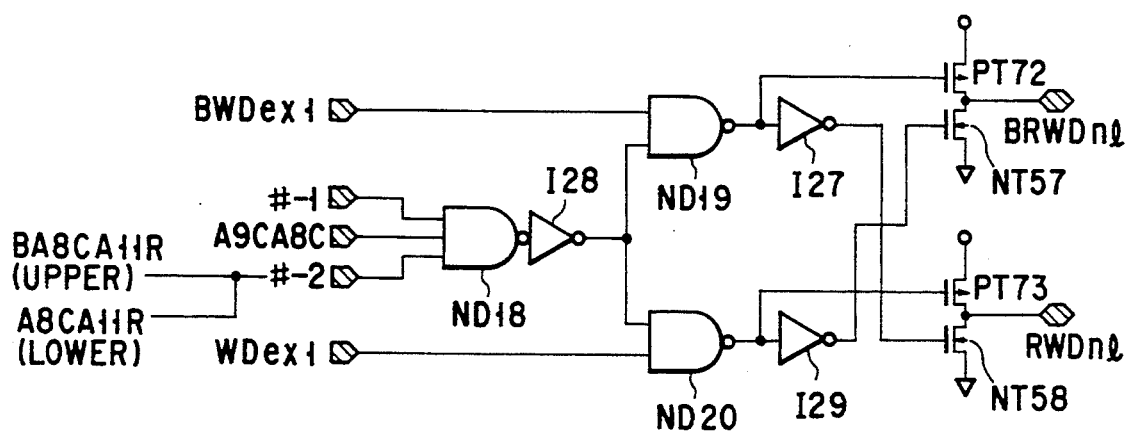
F I G. 16

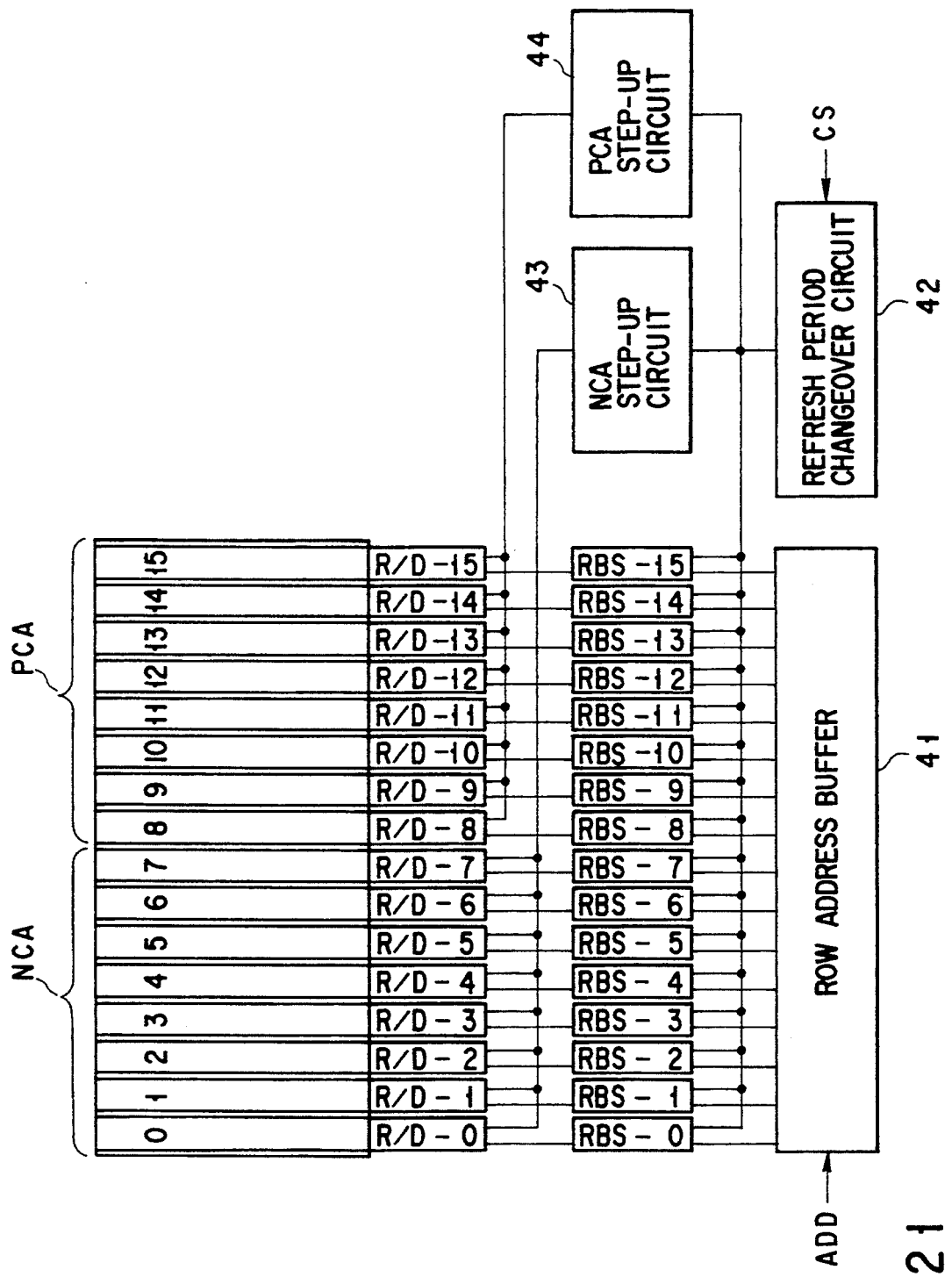
F I G. 21

SEMICONDUCTOR MEMORY DEVICE

BACKGROUND OF THE INVENTION

1. Field of the Invention

This invention relates to, for example, a dynamic RAM (hereinafter, DRAM), and more particularly to a semiconductor memory device where the chip layout of memory cell arrays is improved.

2. Description of the Related Art

The most widely used DRAM families at present are those of ×4 bits. Ordinary users now use fewer simple ×1-bit DRAMs to increase the capacity of electronic equipment. Instead, they are requiring such DRAMs to serve as parts with added values such as the miniaturization of electronic equipment, lower-power dissipation, or higher performance. To meet these needs, DRAMs have been changing gradually from the 256K-bit age to those with more bits, and now the 4M-bit age is coming when DRAM products tend to contain more and more bits, centering around ×8, ×9, ×16, and ×18 bits.

FIGS. 22, 23, and 24 show chip layouts for constructing a ×9-bit or ×18-bit memory in conventional DRAMs or static RAMs (hereinafter, referred to as SRAMs). In FIG. 22, a parity cell array PCA is placed next to a row decoder of a memory 50. This parity cell array PCA corresponds to, for example, the 9th bit, 17th bit, and 18th bit of the memory cell array. In FIG. 23, a parity cell array PCA is located on the opposite side from a row decoder of a memory 60. FIG. 24 illustrates a chip layout where parity cell arrays PCA are provided at the left end of ordinary memory cell arrays (hereinafter, refereed to as NCAs).

With the tendency toward the increasing cell capacity, use of more bits, and more sophisticated functions, the memory chip size tends to increase. Equipment using memories, however, tends to be made more compact, so that it is difficult to make the package size, or the chip size, larger.

The layouts as shown in FIGS. 22 and 23 are best suited for products such as SRAMs whose cell array corresponds to the input/output terminal. In the case of products where a plurality of input/output terminals are provided in the cell array as found in DRAMs, a parity cell array PCA must be outputted from the selected cell array, resulting in the complicated circuit or pattern.

In the case of a chip layout as shown in FIG. 24, because the parity cell arrays PCA are away from the ordinary cell arrays NCA, the increased cell capacity and use of more bits require extra wiring and an additional control circuit. As a result, the chip size becomes larger, and the resulting chip not only cannot be put in a desired package but also is degraded in performance.

SUMMARY OF THE INVENTION

The object of the present invention is to provide a semiconductor memory device which minimizes an increase in the chip size without deteriorating the performance, by allowing the dedicated parity cell arrays and the ordinary cell arrays to be shared to eliminate extra wiring, and which enables simultaneous development of various types of products, thereby improving design efficiency.

The foregoing object is accomplished by providing a semiconductor memory device comprising: a first through a fourth cell array block placed next to each other on a semiconductor substrate, the first through fourth cell array blocks containing memory cells arranged in matrix form; a first peripheral circuit containing a row decoder, the first peripheral circuit being placed between the first and second cell array blocks and between the third and fourth cell array blocks, and being connected to these first through fourth cell array blocks; a second peripheral circuit containing a column decoder, the second peripheral circuit being placed between the first and third cell array blocks and between the second and fourth cell array blocks, and being connected to these first through fourth cell array blocks; and the first through fourth cell array blocks each having ordinary cell arrays and dedicated parity cell arrays, with the total of the ordinary cell arrays and the parity cell arrays being a multiple of 9, and the parity cell arrays being placed between the ordinary cell arrays and the second peripheral circuit.

With a semiconductor memory device of this invention, the parity cell arrays are located between the ordinary cell arrays and the second peripheral circuit. As a result, extra wiring in the circuit controlling the parity cell arrays can be eliminated, thereby making it possible to reduce the wiring resistance and capacity without lowering the performance. Further, because the control signal can be shared by the ordinary cell arrays and the parity cell arrays, an increase in the chip size due to an increase in the number of wires can be suppressed.

Further, the ordinary cell arrays and the parity cell arrays each have read-write circuits of the same construction, with each cell array block sharing a peripheral circuit. Because the construction of the ordinary cell array is almost the same as that of the parity cell array, simply eliminating the parity cell arrays allows a ×9-bit or a ×18-bit product to turn to a ×8-bit or a ×16-bit product. As a result, various types of products can be designed efficiently.

BRIEF DESCRIPTION OF THE DRAWINGS

The accompanying drawings, which are incorporated in and constitute a part of the specification, illustrate presently preferred embodiments of the invention, and together with the general description given above and the detailed description of the preferred embodiments given below, serve to explain the principles of the invention.

FIG. 4 is a circuit diagram of a portion of the cell array;

FIG. 5 is a plan view showing the relationship between cell arrays of FIG. 1;

FIG. 7 is a circuit diagram of a portion for generating an activating signal to the data column-line amplifier circuit DQB in an example of the data column-line control circuit DSB of FIG. 6;

FIG. 8 is a circuit diagram of a portion for generating various control signals to the data column-line amplifier circuit DQB in an example of the data column-line control circuit DSB of FIG. 6;

FIG. 11 is a circuit diagram of an example of an ordinary cell array data read switch circuit;

FIG. 15 is a circuit diagram of an example of an ordinary cell array read-write line write circuit;

FIG. 16 is a circuit diagram of a parity cell array read-write line write circuit;

FIG. 21 is a schematic diagram of a refresh circuit composed of ordinary cell arrays and parity cell arrays according to a third embodiment of the present invention;

DETAILED DESCRIPTION OF THE PREFERRED EMBODIMENTS

Hereinafter, embodiments of the present invention will be explained, referring to the accompanying drawings.

Figure 1:
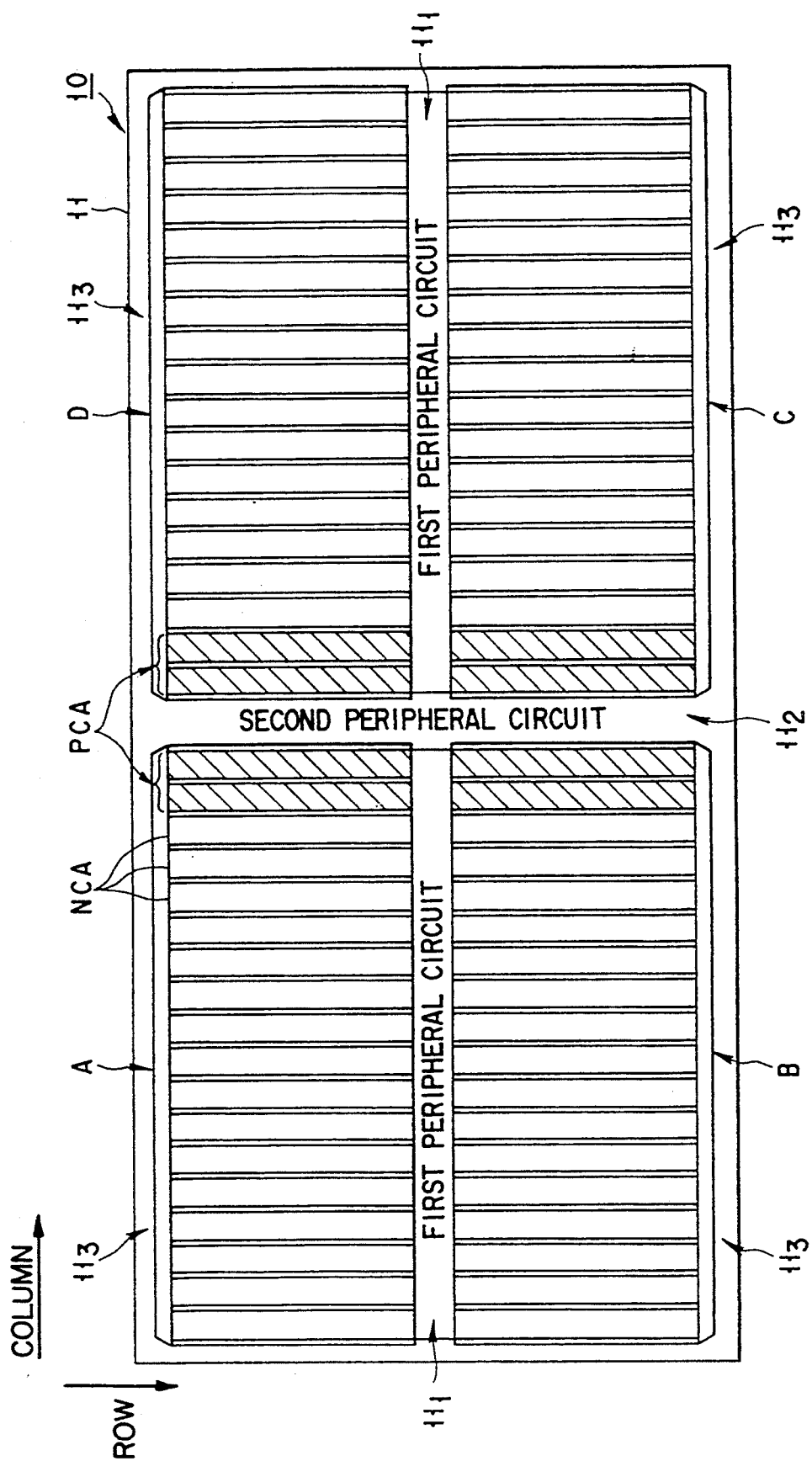
FIG. 1 is a plan view of a chip layout according to an embodiment of the present invention.

FIG. 1 shows a chip layout of a ×18-bit structure, for example. A memory 11 is formed on a semiconductor substrate 10. The memory 11 is divided into four 4.5M-bit cell array blocks A, B, C, and D. Each of the cell array blocks A, B, C, and D are further divided into eighteen 256K-bit blocks to produce 72 cell arrays in total. Between cell array blocks A and B, and between cell array blocks C and D, first peripheral circuits $11_1$ containing row decoders for selecting word lines (not shown) are placed, respectively. Between cell array blocks A and D, and between cell array blocks B and C, a second peripheral circuit $11_2$ containing a column decoder for selecting column lines is placed. Around the cell array blocks A through D, third peripheral circuits $11_3$ are provided each of which contains bonding pads and an input protective circuit (not shown), a data signal-line amplifier circuit DQB explained later, and a data signal-line control circuit DBS for controlling the data signal-line amplifier circuit DQB.

In the figure, the shaded portions indicate cell arrays for parity only, or parity cell arrays PCA, and the other arrays are ordinary cell arrays NCA. The parity cell arrays PCA are located between the ordinary cell arrays NCA and the second peripheral circuit 112.

FIGS. 2, 3A, 3B, and 4 show concrete arrangements of the cell arrays shown in FIG. 1. Because the cell array blocks A through D have almost the same arrangement, a concrete arrangement of cell array block B will be explained as representative of the rest.

Figure 2:
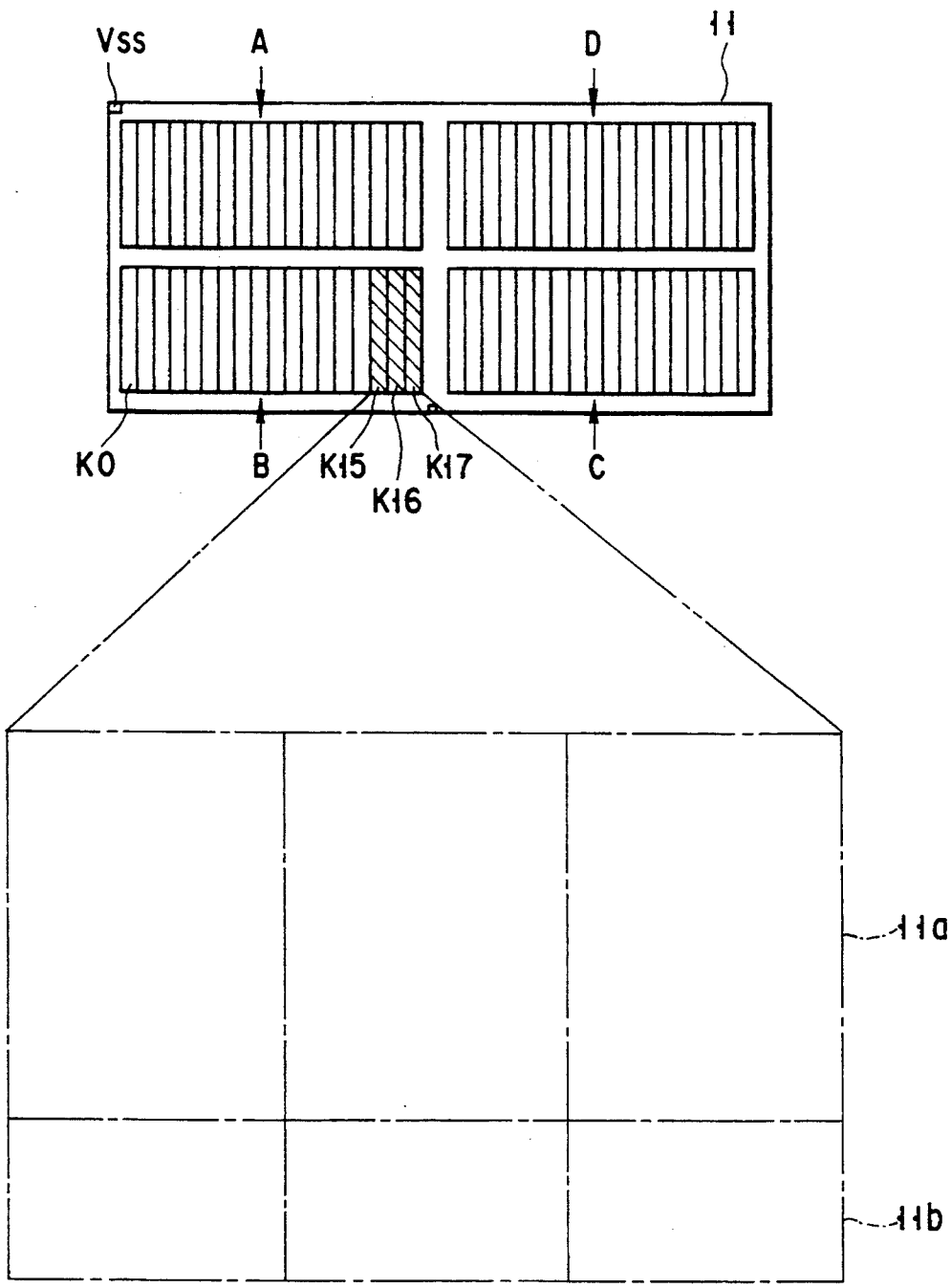
FIG. 2 is a view for explaining a concrete arrangement of the cell array of FIG. 1.
Figure 3A:
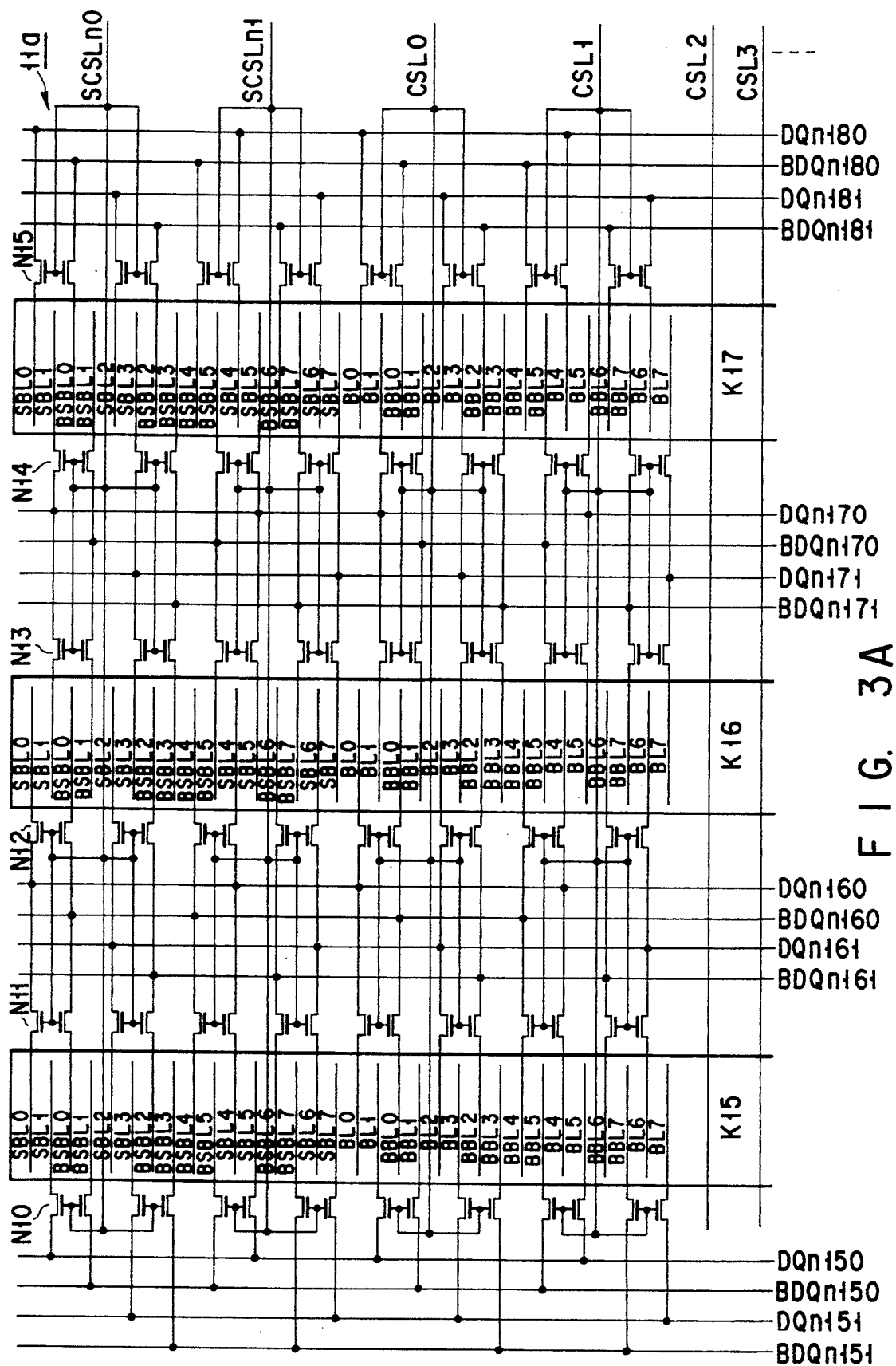
FIG. 3A is a detailed circuit diagram of portion 11a of FIG. 2.
Figure 3B:
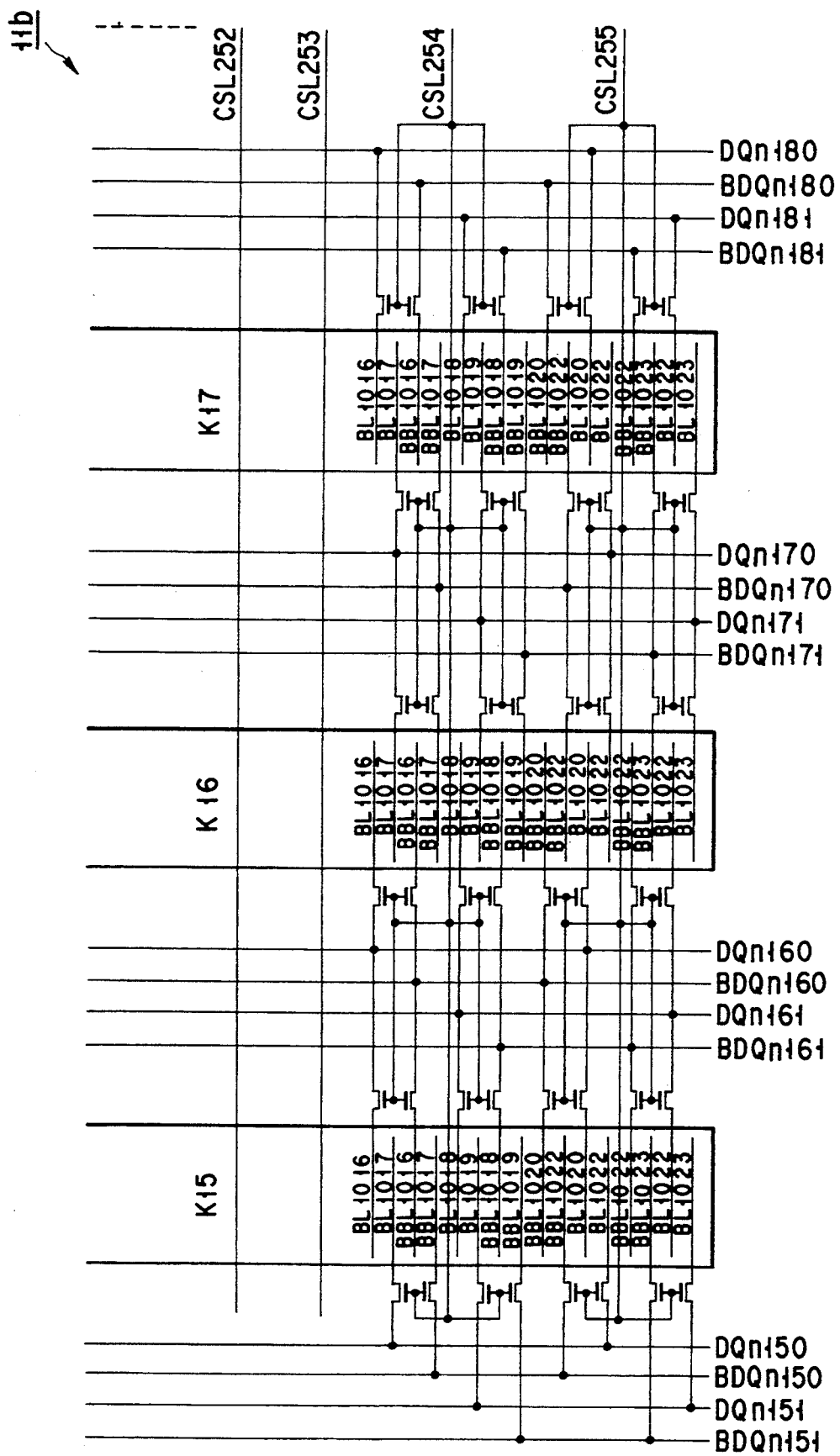
FIG. 3B is a detailed circuit diagram of portion 11b of FIG. 2.

FIGS. 3A and 3B show ordinary cell array (NCA) K15, parity cell arrays (PCA) K16 and K17 in cell array block B divided as shown in FIG. 2. FIG. 3A corresponds to portion 11a of FIG. 2 and FIG. 3B corresponds to portion 11b. The ordinary cell arrays (not shown) other than K15 have the same arrangement as that of K15.

In FIGS. 3A and 3B, the individual cell arrays K15 through K17 are each made up of 256K bits. In each of cell arrays K15 through K17, BLn and BBLn (n=0 to 1023) indicate a pair of bit lines, and SBLn and BSBLn (n=0 to 7) denote a pair of spare bit lines. The BBLn is an inverted signal of BLn, and the BSBLn is an inverted signal of SBLn. Hereinafter, B marked at the head of a symbol is assumed to indicate an inverted signal. Memory cells (not shown) are connected to the individual bit lines BLn and BBLn and spare bit lines SBLn and BSBLn of each of cell arrays K15 through K17, respectively. CSL0 through CSL 255 indicate column lines, and SCSLn0 and SCSLn1 indicate spare column lines.

FIG. 4 illustrates a portion of the cell array K16. Memory cells MC are provided at intersections of spare bit lines SBL0, SBL1, BSBL0, and BSBL1 and word lines WL. The memory cell is composed of, for example, a transistor and a capacitor. Spare bit lines SBL0 and BSBL0 are connected to a sense amplifier (S/A) 14, and spare bit lines SBL1 and BSBL1 are connected to a sense amplifier 15. The data read from the memory cell onto the spare bit lines is amplified by the sense amplifier 14 or 15.

On both sides of each of cell arrays K15 through K17, two pairs of data signal lines DQn150, BDQn150, DQn151, BDQn151 through DQn180, BDQn180, DQn181, BDQn181 are provided respectively. These data signal lines DQn150, BDQn150, DQn151, BDQn151 through DQn180, BDQn180, DQn181, BDQn181 are connected via transistors to the spare bit lines SBLn and BSBLn (n=0 to 7) and bit lines BLn and BBLn (n=0 to 1023) of the individual cell arrays K15 through K17, respectively.

For example, the current path of n-channel transistor N10 is connected to spare bit line SBL1 and data signal line DQn 150 of cell array K15, and the current path of n-channel transistor N11 is connected to spare bit line SBL0 and data signal line DQn 160 of cell array K15. Further, the current path of n-channel transistor N12 is connected to spare bit line SBL0 and data signal line DQn 160 of cell array K16, and the current path of n-channel transistor N13 is connected to spare bit line SBL1 and data signal line DQn 170 of cell array K16. Still further, the current path of n-channel transistor N14 is connected to spare bit line SBL1 and data column line DQn 170 of cell array K17, and the current path of n-channel transistor N15 is connected to spare bit line SBL0 and data column line DQn 180 of cell array K17. The gates of these transistors N10 through N15 are connected to spare column line SCSLn0. Therefore, when the transistors N10 through N15 are selected, the spare bit lines are connected to the data signal lines. The back gate bias for the transistors in FIGS. 3 and 4 is different from that for the transistors of the other circuits and is set to $V_{BB}$.

Since the arrangement between the ordinary cell arrays NCA, that between the ordinary cells and the parity cell arrays PCA, and that between the parity cell arrays PCA are all the same as the above arrangement, the circuit between these cell arrays are all standardized.

With this arrangement, data reading will be explained, for example.

A case where cell array K16 is selected by an address signal and column line CSL0 is selected is now considered. According to the selected address, the word line for cell array K16 is selected, and the data in the memory cell corresponding to the word line is transferred onto bit lines. Because a case where column line CSL0 is selected is now being considered, the data on bit lines BL0 thEough BL3, and BBL0 through BBL3 is transferred to sets of two pairs of DQ lines DQn160, BDQn160, DQn161, BDQn161, DQn170, BDQn170, and DQn171, BDQn17 on both sides of cell array K16.

Next explained will be a circuit for selecting the data signal lines DQn and BDQn.

The relationship between the individual cell arrays is shown in FIG. 5. In the figure, k=0 to 17 indicate 256K-bit cell arrays, and P=0 to 18 indicate area numbers of intervals between cell arrays. As mentioned earlier, the sense amplifier, data signal lines, and transistors for connecting data signal lines to bit lines or spare bit lines are placed between the cell arrays.

Figure 6:
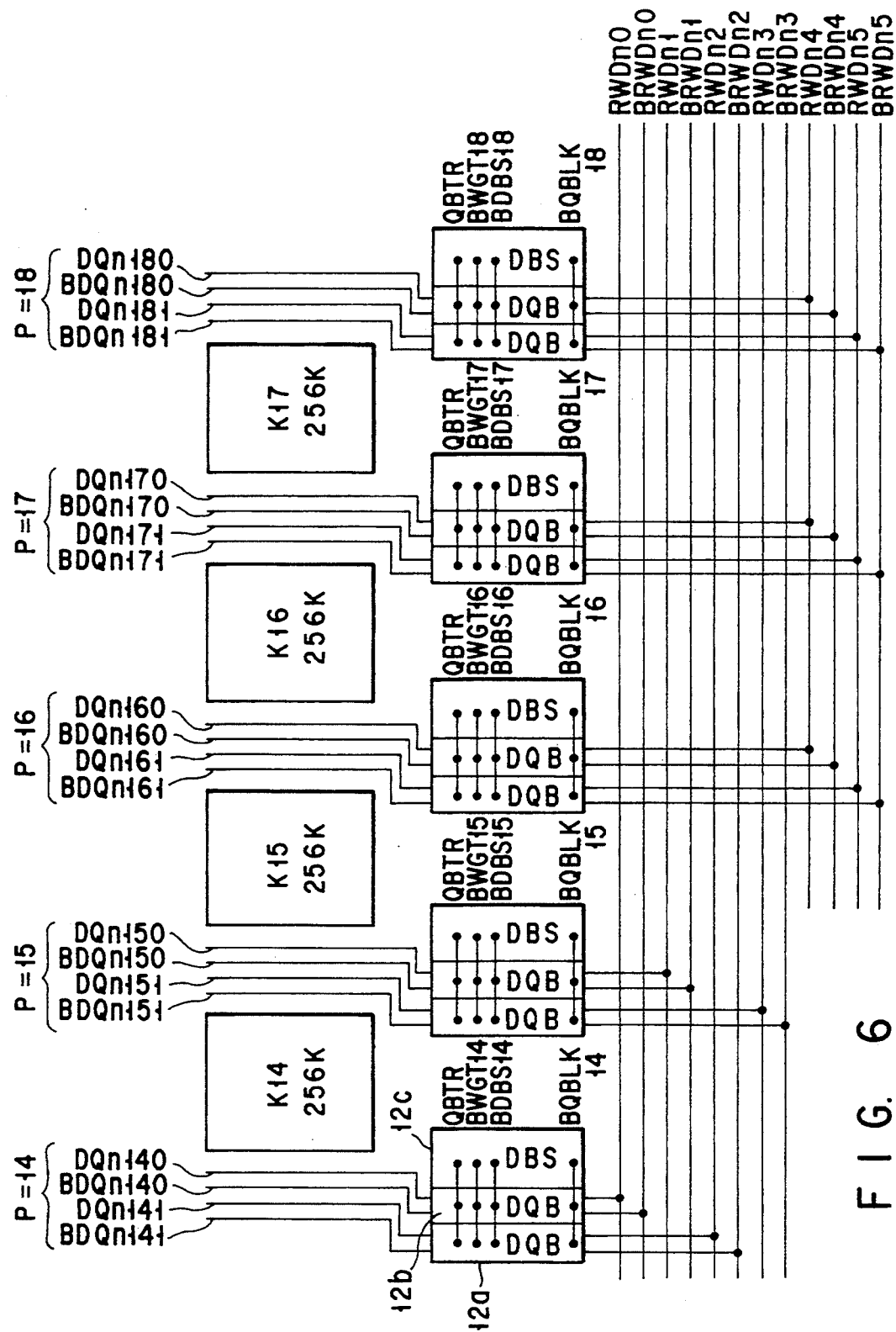
FIG. 6 is a schematic diagram of the shaded portion in FIG. 5.

FIG. 6 is an enlarged circuit diagram of the shaded portion of FIG. 5. On both sides of each of cell arrays K14 through K17, the data signal lines DQnij and BDQnij (i=14 to 18, j=0, 1) are located. These data signal lines DQnij and BDQnij are connected to pairs of data signal-line amplifier circuits DQB, DQB located between the cell arrays. These data signal-line amplifier circuits DQB, DQB are connected to data signal-line control circuits, respectively, which selectively control the data signal-line amplifier circuits DQB, DQB. The data signal-line amplifier circuits DQB, DQB, under the control of the data signal-line control circuit DBS, selectively connect data signal lines DQnij, BDQnij to read-write lines RWDnl, BRWDnl (l=0 to 5) during a write and a read operation.

Specifically, a pair of data signal-line amplifier circuits DQB, DQB located at cell array interval P=14 connects data signal lines DQn140, BDQn140, DQn141, BDQn141 to read-write lines RWDn0, BRWDn0, RWDn2, BRWDn2, respectively. A pair of data signal-line amplifier circuits DQB, DQB located at area number P=15 connects data signal lines DQn150, BDgn150, DQn151, BDQn151 to read-write lines RWDn1, BRWDn1, RWDn3, BRWDn3, respectively. A pair of data signal-line amplifier circuits DQB, DgB located at area number P=16 connects data column lines DQn160, BDgn160, DQn161, BDQn161 to read-write lines RWDn4, BRWDn4, RWDn5, BRWDnS, respectively. A pair of data signal-line amplifier circuits DQB, DQB located at area number P=17 connects data signal lines DQn170, BDQn170, DQn171, BDQn171 to read-write lines RWDn4, BRWDn4, RWDn5, BRWDnS, respectively. A pair of data signal-line amplifier circuits DQB, DQB located at area number P=18 connects data signal lines DQn180, BDQn180, DQn181, BDQn181 to read-write lines RWDn4, BRWDn4, RWDnS, BRWDn5, respectively.

For example, in the case of a ×8-bit product or a ×9-bit product, when ordinary cell array K14 and area number P=14 is selected, data signal-line amplifier circuits DQB, DQB connect data signal lines DQn140, BDQn140, DQn141, BDQn141 to read-write lines RWDn0, BRWDn0, RWDn2, BRWDn2, respectively. Further, when parity cell array K16 or K17 is selected, data signal-line control circuit DBS actuates either of signal-line amplifier circuits DQB, DQB on both sides of parity cell array K16 or K17 to connect data signal lines to read-write lines RWDn4, BRWDn4, RWDn5, BRWDn5.

Because all the pairs of data signal-line amplifier circuits DQB, DQB have the same configuration and similarly all the data signal-line control circuits DBS have the same configuration, the configuration of data signal-line amplifier circuits DQB(12a), DQB(12b) located at area number P=14 and that of data signal-line control circuit DBS(12c) will be explained as representative of the rest.

FIGS. 7 and 8 show data signal-line control circuit DBS.

FIG. 7 depicts a circuit for generating an activating signal BDBS14 to activate data signal-line amplifier circuits DQB, DQB provided on both sides of the selected cell array. The activating signal BDBS14 is determined by a combination of right-left select signals DBSCKN-A1, DBSCKN-B1, cell array select signals A9CASCL-A2, A9CA8CL-B2 produced according to an address, and equalize signals BEQLA, BEQLB. This combination is determined with a combining circuit composed of NAND circuits ND4, ND5 and NOR circuits NR11, NR12, NR13. The activating signal BDBS14 is outputted from the NOR circuit NR13.

FIG. 8 shows a circuit for generating a write signal BWGT14, a read enable signal QBTR for enabling a read operation, a transfer enable signal BQBLK14 for enabling the transfer of the data on the data signal lines to read-write lines RWDn1, BRWDn1, and a latch signal BQLTC14.

This circuit produces each of the above signals by using the activating signal BDBS14, a setting signal BQDRVLN for setting an action during a write and a read operation (a low level during a write operation and a high level during a read operation), an activating signal QSELN for transferring data from data signal lines to read-write lines RWDn1, BRWDn1 (a low level during a write operation and a high level during a read operation), and a precharge signal CEQP for data signal lines, with the setting signal BQDRVLN and activating signal BDBS14 supplied to the input terminal of the NOR circuit NR10. An inverter circuit 15 is connected to the output terminal of the NOR circuit NR10. The inverter circuit I5 outputs the write signal BWGT14 at its output terminal.

The activating signal BDBS14 is supplied to one input terminal of a NAND circuit ND1 via an inverter circuit I6. The other input terminal of the NAND circuit ND1 is supplied with the activating signal QSELN. The output terminal of the NAND circuit ND1 is connected to one input terminal of a NAND circuit ND3 via an inverter circuit I7. The other input terminal of the NAND circuit ND3 is connected to the output terminal of the inverter circuit I5. The NAND circuit ND3 outputs the transfer enable signal BQBLK14 at its output terminal. The output terminal of the NAND circuit ND3 is connected to one input terminal of a NAND circuit ND2. The output terminal of the inverter circuit I5 is connected to the other input terminal of the NAND circuit ND2. The NAND circuit ND2 outputs the read enable signal QBTR at its output terminal.

Between a first power supply (a round mark in the figure indicates Vcc) and a second power supply (a rectangular mark in the figure indicates Vss), the current path of a p-channel transistor PT37 and those of n-channel transistors NT17 and NT18 are connected in series. The gates of the transistors PT37 and NT17 are supplied with the precharge signal CEQP, and the gate of the transistor NT18 is supplied with the output signal from the inverter circuit I7. The latch signal BQLTC14 is output from the junction point of the transistors PT37 and NT17.

Figure 9:
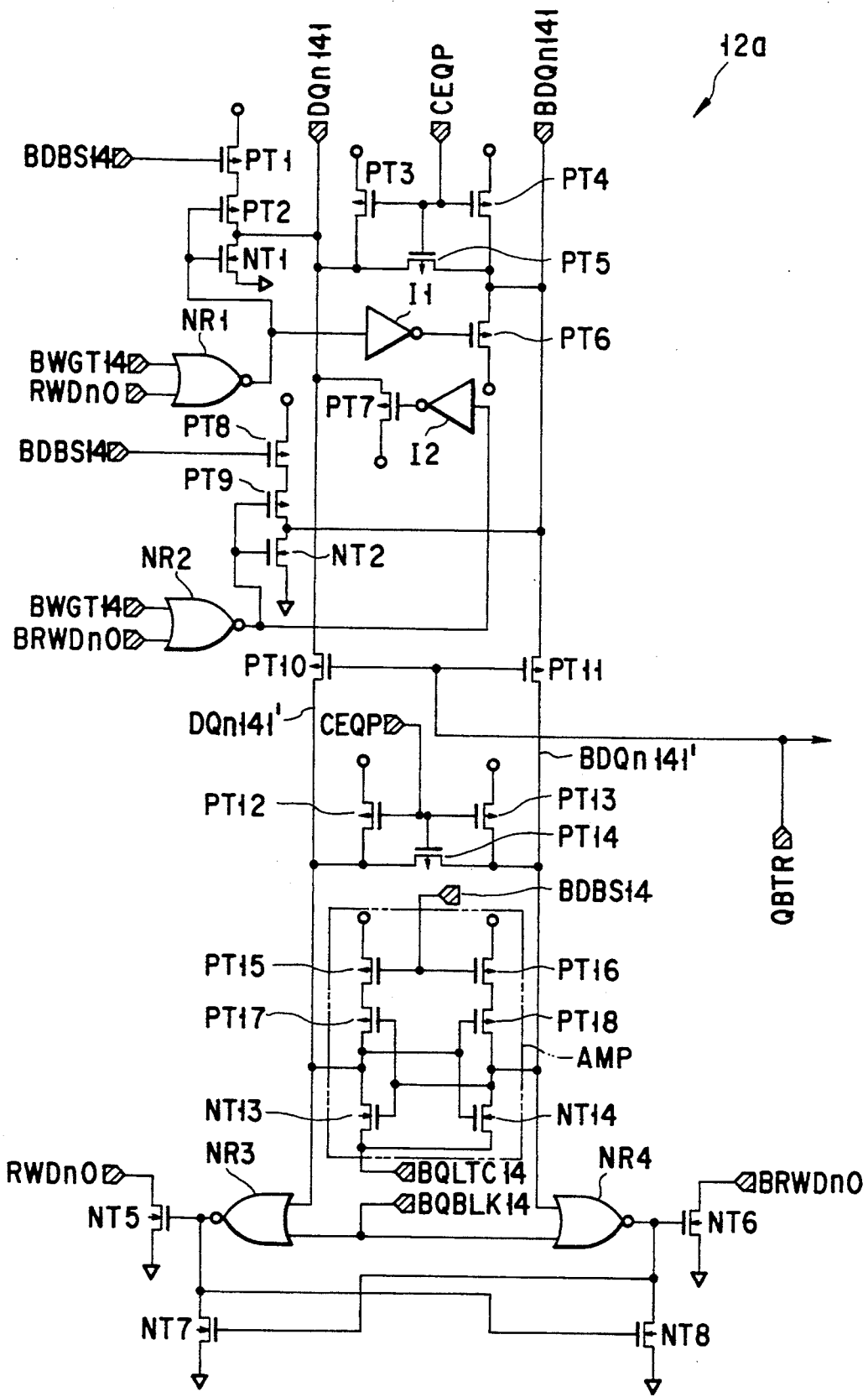
FIG. 9 is a circuit diagram of an example of the data column-line amplifier circuit DQB12a of FIG. 6.
Figure 10:
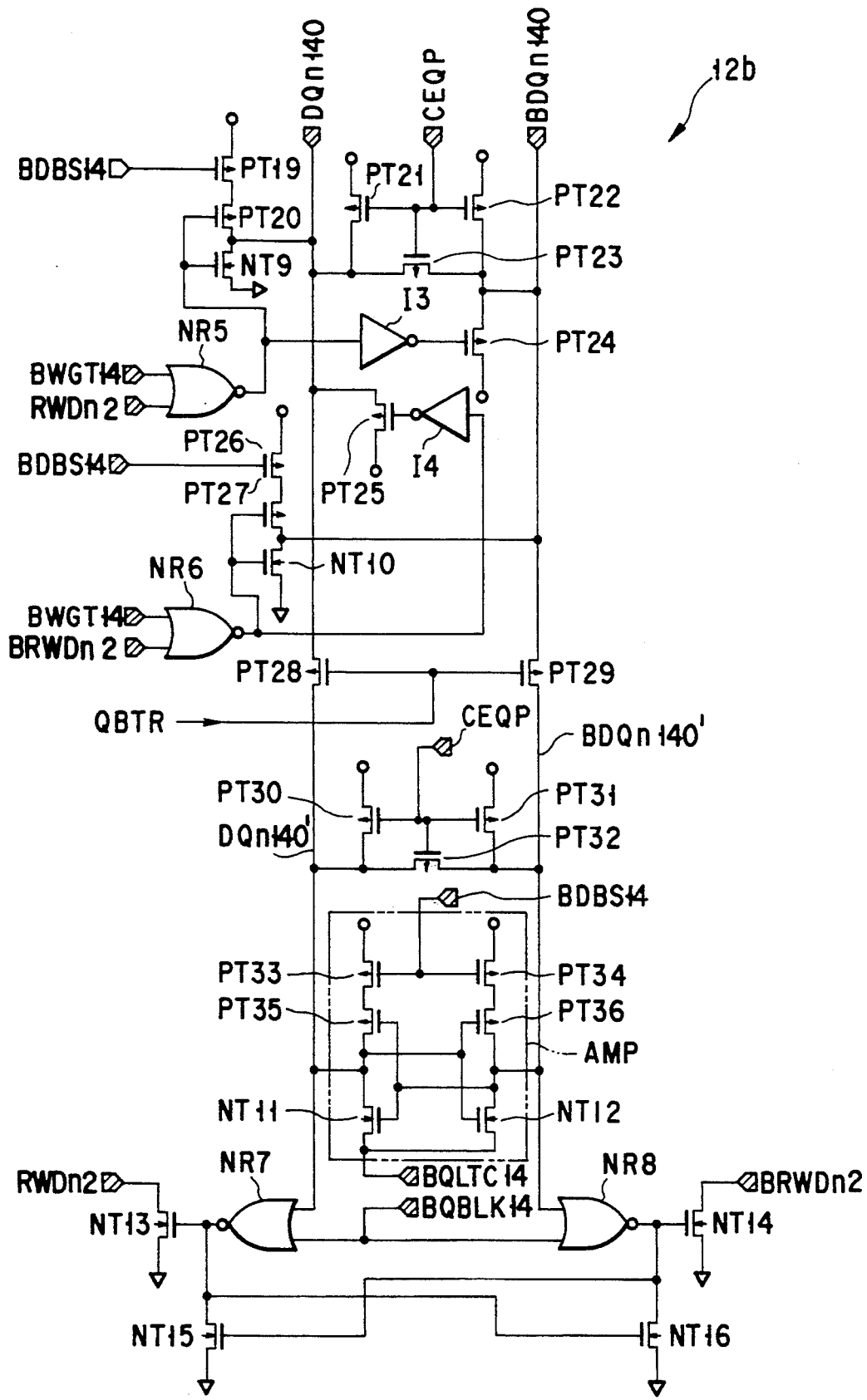
FIG. 10 is a circuit diagram of an example of the data column-line amplifier circuit DQB12b of FIG. 6.

FIG. 9 shows data signal-line amplifier circuit DQB (12a), and FIG. 10 shows data signal-line amplifier circuit DQB (12b). Because the data signal-line amplifier circuits 12a and 12b have the same arrangement, only the data signal-line amplifier circuit 12a will be explained.

In FIG. 9, the current paths of p-channel transistors PT1 and PT2 and that of an n-channel transistor NT1 are connected in series between the first and the second power supply. The gate of the transistor PT1 is supplied with the activating signal BDBS14 from the data signal-line control circuit DBS. The write signal BWGT14 supplied from the data signal-line control circuit DBS and the signal on the read-write line RWDn0 are supplied to the input terminal of the NOR circuit NR1. The output terminal of the NOR circuit NR1 is connected to the gates of the transistors PT2 and NT1. The junction point of the transistors PT2 and NT1 is connected to data signal line DQn141.

The current paths of p-channel transistors PT8 and PT9 and that of an n-channel transistor NT2 are connected in series between the first and the second power supply. The gate of the transistor PT8 is supplied with the activating signal BDBS14. The write signal BWGT14 and the signal on the read-write line BRWDn0 are supplied to the input terminal of the NOR circuit NR2. The output terminal of the NOR circuit NR2 is connected to the gates of the transistors PT9 and NT2. The junction point of the transistors PT9 and NT2 is connected to data signal line BDQn141.

Between data signal lines DQn141 and BDQn141, p-channel transistors PT3, PT4, and PT5 constituting a precharge circuit is provided. The current path of the transistor PT3 is connected between the first power supply and data signal line DQn141, the current path of the transistor PT4 is connected between the first power supply and data signal line BDQn141 and the current path of the transistor PT5 is connected between data column line DQn141 and data signal line BDQn141. The gates of these transistors PT3, PT4, and PT5 are supplied with the precharge signal CEQP.

The current path of a p-channel transistor PT6 is connected between the first power supply and data signal line BDQn141. The output terminal of the NOR circuit NR1 is connected to the gate of the transistor PT6 via an inverter circuit I1. The current path of a p-channel transistor PT7 is connected between the first power supply and data signal line DQn141. The output terminal of the NOR circuit NR2 is connected to the gate of the transistor PT7 via an inverter circuit I2.

The current path of a p-channel transistor PT10 is inserted between the data signal line DQn141 and data signal line DQn0141', and the current path of a p-channel transistor PT11 is inserted between the data signal line BDQn141 and data column line BDQn141'. The gates of these transistors PT10 and PT11 are supplied with the read enable signal QBTR from the data signal-line control circuit DBS. The read enable signal QBTR is made low during a read operation.

Between data signal lines DQn141' and BDQn14', p-channel transistors PT12, PT13, and PT14 constituting a precharge circuit are provided. The current path of the transistor PT12 is connected between the first power supply and data signal line DQn141', and the current path of the transistor PT13 is connected between the first power supply and data signal line BDQn141', and the current path of the transistor PT14 is connected between data signal line DQn141' and data signal line BDQn141'. The gates of these transistors PT12, PT13, and PT14 are supplied with the precharge signal CEQP.

Further, between the data signal lines DQn141' and BDQn141', p-channel transistors PT15 through PT18 and n-channel transistors NT13 and NT14 constituting an amplifier AMP are provided. Specifically, the current paths of the transistors PT15, PT17, and NT13 are connected in series between the first power supply and the input terminal of the latch signal BQLTC14 supplied from the data signal-line control circuit DBS. Similarly, the current paths of the transistors PT16, PT18, and NT14 are also connected in series between the first power supply and the input terminal of the latch signal BQLTC14 supplied from the data signal-line control circuit DBS. The gates of transistors PT15 and PT16 are supplied with the activating signal BDBS14. The junction point of the current paths of transistors PT17 and NT13 is connected to data column line DQn141', and the gates of transistors PT17 and NT13 are connected to data signal line BDgn141'. The junction point of the current paths of transistors PT18 and NT14 is connected to data signal line BDQn141', and the gates of transistors PT18 and NT14 are connected to data signal line DQn141'.

Data signal line DQn141' is connected to one input terminal of a NOR circuit NR3, and data signal line BDQn141' is connected to one input terminal of a NOR circuit NR4. The other input terminals of these NOR circuits NR3 and NR4 are connected to each other, and are supplied with the transfer enable signal BQBLK14 from the data signal-line control circuit DBS.

The output terminal of the NOR circuit NR3 is connected to the gate of an n-channel transistor NT5. The current path of the n-channel transistor NT5 is connected between read-write line RWDn0 and the second power supply. The output terminal of the NOR circuit NR4 is connected to the gate of an n-channel transistor NT6. The current path of the n-channel transistor NT6 is connected between read-write line BRWDn0 and the second power supply.

Between the output terminal of the NOR circuit NR3 and the second power supply, the current path of an n-channel transistor NT7 is connected. The gate of the transistor NT7 is connected to the output terminal of the NOR circuit NR4. Between the output terminal of the NOR circuit NR4 and the second power supply, the current path of an n-channel transistor NT8 is connected. The gate of the transistor NT8 is connected to the output terminal of the NOR circuit NR3.

With the above configuration, to read data, the activating signal BDBS14 is made low and the p-channel transistors PT10 and PT11 are brought into a conductive state by the read enable signal QBTR. The signals on data signal lines DQn141 and BDQn141, after being amplified with the amplifier AMP, are transferred to read-write lines RWDn0 and BRWDn0 via NOR circuits NR3 and NR4 and n-channel transistors NT5 and NT6.

To write data, the activating signal BDBS14 is made low and the p-channel transistors PT10 and PT11 are brought into a nonconductive state by the read enable signal QBTR. The write signal BWGT14 is made low and the signals on read-write lines RWDn0 and BRWDn0 are outputted from NOR circuits NR1 and NR2. The output signal of NOR circuit NR1 is supplied to data signal line DQn141 via p-channel transistor PT2 and n-channel transistor NT1. The output signal of NOR circuit NR2 is supplied to data signal line BDQn141 via p-channel transistor PT9 and n-channel transistor NT2.

As mentioned above, the data transferred from ordinary cell arrays K14 and K15 to read-write lines RWDnl and BRWDn1 is transferred to ordinary cell array read lines (not shown) via an ordinary cell-array data-read switch circuit shown in FIG. 11, and then is further transferred to an output circuit. Similarly, the data transferred from parity cell arrays K16 and K17 to read-write lines RWDnl and BRWDn1 is transferred to dedicated parity read lines via a parity cell-array data-read switch circuit shown in FIG. 12, and then is further transferred to an output circuit and then outputted at the parity input/output terminals. The operation of a switch connecting the data on the read-write lines RWDnl and BRWDn1 to the Read lines is controlled by a signal selecting an address and ×8, ×9, ×16, or ×18.

FIG. 11 shows the ordinary cell-array data-read switch circuit. The arrangement of an ordinary cell-array data-read switch provided on read-write line RWDnl is the same as that of an ordinary cell-array data-read switch provided on read-write line BRWDn1. For this reason, the arrangement of only the ordinary cell-array data-read switch circuit provided on read-write line RWDnl will be explained.

The input terminal of a NAND circuit ND6 is supplied with cell array select signals A8R, A9R, A9-CA10R, and A8CA11R produced according to the address signal. The output terminal of the NAND circuit ND6 is connected to one input terminal of NOR circuit NR14. The other input terminal of the NOR circuit NR14 is supplied with a test signal TEST. This test signal TEST is made high in the test mode and is normally in a low level. The output terminal of the NOR circuit NR14 is connected to the gates of n-channel transistors NT19 and NT23 constituting switches S1 and S2. It is also connected via an inverter circuit I8 to the gates of p-channel transistors PTB8 and PT43 constituting switches S1 and S2. One end of the current path of transistors NT19 and PT38 constituting the switch S1 is connected to read-write line RWDn4 (BRWDn4) and the other end is connected to read line RDn11 (BRDn11). One end of the current path of transistors NT23 and PT43 constituting the switch S2 is connected to read-write line RWDn5 (BRWDn5) and the other end is connected to read line RDn12 (BRDn12).

The input terminal of a NAND circuit ND7 is supplied with the output signal of the NAND circuit ND6, a cell array select signal A9CA8C produced according to an address signal, and a test signal TEST inverted by an inverter circuit I10. The output terminal of the NAND circuit ND7 is connected via an inverter circuit I9 to the gates of n-channel transistors NT20 and NT24 constituting switches S3 and S4. It is also connected to the gates of p-channel transistors PT39 and PT44 constituting the switches S3 and S4. One end of the current path of transistors NT20 and PT39 constituting the switch S3 is connected to read-write line RWDn0 (BRWDn0), and the other end is connected to read line RDn11 (BRDn11). One end of the current path of transistors NT24 and PT44 constituting the switch S4 is connected to read-write line RWDn2 (BRWDn2), and the other end is connected to read line RDn12 (BRDn12).

The input terminal of a NOR circuit NR15 is supplied with a test signal TEST and a product identifying signal ×16×18. This product identifying signal ×16×18 is made high when the product is of ×16 bits or ×18 bits and made low when the product is of ×8 bits or ×9 bits.

The input terminal of a NAND circuit ND8 is supplied with the output signal of the NAND circuit ND6, a cell array select signal A9CASC produced according to an address signal, and the output signal of the NOR circuit NR15. The output terminal of the NAND circuit ND8 is connected via an inverter circuit I11 to the gates of n-channel transistors NT21 and NT25 constituting switches S5 and S6. It is also connected to the gates of p-channel transistors PT40 and PT45 constituting switches S5 and S6. One end of the current path of transistors NT21 and PT40 constituting the switch S5 is connected to read-write line RWDnl (BRWDn1), and the other end is connected to read line RDn11 (BRDn11). One end of the current path of transistors NT25 and PT45 constituting the switch S6 is connected to read-write line RWDn3 (BRWDn3), and the other end is connected to read line RDn12 (BRDn12).

Further, the product identifying signal ×16×18 is connected to the gates of n-channel transistors NT22 and NT26 constituting switches S7 and S8. It is also connected via an inverter I12 to the gates of p-channel transistors PT41 and PT46 constituting switches S7 and S8. One end of the current path of transistors NT22 and PT41 constituting the switch S7 is connected to read-write line RWDnl (BRWDn1) and the other end is connected to read line RDn21 (BRDn21). One end of the current path of transistors NT26 and PT46 constituting the switch S8 is connected to read-write line RWDn3 (BRWDn3) and the other end is connected to read line RDn22 (BRDn22). Between read line RDn21 (BRDn21) and the first power supply, the current path of p-channel transistor PT42 is connected. The gate of the transistor PT42 is connected to the gate of the transistor NT22. Further, between read line RDn22 (BRDn22) and the first power supply, the current path of p-channel transistor PT47 is connected. The gate of the transistor PT47 is connected to the gate of the transistor NT26.

In the ordinary cell-array data-read switch circuit, switches S1 through S6 are turned on and off according to cell array select signals ASR, A9R, A9CA10R, A8-CA11R, A9CA8C, a product identifying signal ×16×18, and a test signal TEST, and switches S7 and S8 are turned on and off according to a product identifying signal ×16×18.

For example, when ordinary cell array K14 is selected, the data transferred from ordinary cell array K14 to read-write line RWDnl (BRWDn) (l=0, 1, 2, 3) is supplied to the ordinary cell-array data-read switch circuit. In this case, because ordinary cell array K14 is selected, the output of NAND circuit ND6 goes high. When the product is of ×16 bits or ×18 bits, the product identifying signal ×16×18 is high and the cell array select signal A9CASC is also high. Therefore, switches S1, S2, S5, and S6 are off, and switches S3, S4, S7, and S8 are on, which permits the data on read-write line RWDn1 (BRWDn1) to be transferred to read lines RDn11, RDn12, RDn21, and RDn22, respectively.

When the product is of ×8 bits or ×9 bits, the product identifying signal ×16×18 goes low and the cell array select signal A9CA8C turns off switches S1, S2, S7, and S8, and turns on switches S3, S4, S5, and S6, which permits the data on read-write line RWDn1 (BRWDn1) to be transferred to read lines RDn11 and RDn12, respectively.

Further, for example, when ordinary cell array K15 is selected, the output of NAND circuit ND6 goes low. When the product is of ×16 bits or ×18 bits, the product identifying signal ×16×18 is high. Therefore, switches S3, S4, S5, and S6 are off, and switches S1, S2, S7, and S8 are on, which allows the data on read-write line RWDn4 (BRWDn4), RWDn5 (BRWDn5) to be transferred to read lines RDn11, RDn12, respectively, and the data on read-write lines RWDn1 (BRWDn1), RWDn3 BRWDn3) to read lines RDn21 and RDn22, respectively.

When ordinary cell array K15 is selected, the product is of ×8 bits or ×9 bits, and cell array interval P=15 is selected, then the output of the NAND circuit ND6 goes high, which turns off switches S1, S2, S3, S4, S7, and S8, and turns on switches S5 and S6. As a result, the data on read-write line RWDn1 (BRWDn1), RWDn3 (BRWDn3) is transferred to read lines RDn11 and RDn12, respectively.

When ordinary cell array K15 is selected, the product is of ×8 bits or ×9 bits, and cell array interval P=16 is selected, then the output of the NAND circuit ND6 goes low, which turns off switches S3, S4, S5, S6, S7, and S8, and turns on switches S1 and S2, which allows the data on read-write line RWDn4 (BRWDn4), RWDn5 (BRWDnS) to be transferred to read lines RDn11 and RDn12, respectively.

Figure 12:
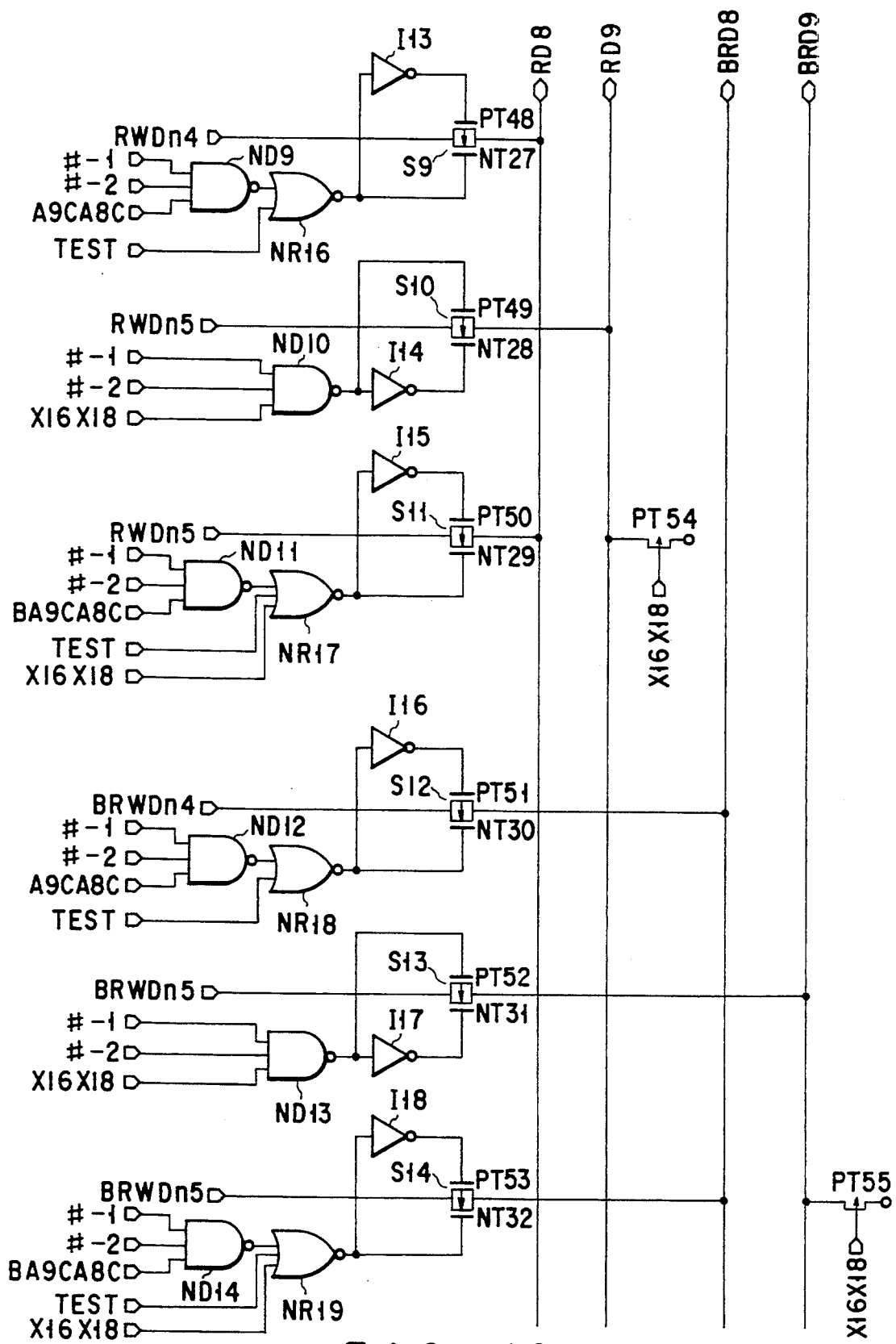
FIG. 12 is a circuit diagram of an example of a parity cell data read switch circuit.

FIG. 12 is a parity cell data read switch circuit.

The input terminal of a NAND circuit ND9 is supplied with cell array select signals #-1, #-2 and a cell array select signal A9CA8C. The cell array select signal #-1 is, for example, BA9R, and the cell array select signal #-2 is, for example, BA8CA11R. The output terminal of the NAND circuit ND9 is connected to one input terminal of a NOR circuit NR16. The other input terminal of the NOR circuit NR16 is supplied with the test signal TEST. The output terminal of the NOR circuit NR16 is connected to the gate of an n-channel transistor NT27 constituting a switch S9. It is also connected to via an inverter circuit I13 to the gate of a p-channel transistor PT48 constituting the switch S9. One end of the current path of transistors NT27 and PT48 constituting the switch S9 is connected to read-write line RWDn4, and the other end is connected to dedicated parity read line RD8.

The input terminal of a NAND circuit ND10 is supplied with cell array select signals #-1, #-2 and a product identifying signal ×16×18. The output terminal of the NAND circuit ND10 is connected via an inverter circuit I14 to the gate of an n-channel transistor constituting a switch S10. It is also connected to the gate of a p-channel transistor PT49 constituting the switch S10. One end of the current path of transistors NT28 and PT49 constituting the switch S10 is connected to read-write line RWDn5, and the other end is connected to dedicated parity read line RD9.

The input terminal of a NAND circuit ND11 is supplied with cell array select signals #-1, #-2 and a cell array select signal BA9CA8C. The output terminal of the NAND circuit ND11 is connected to the input terminal of a NOR circuit NR17. The input terminal of the NOR circuit NR17 is also supplied with the test signal TEST and product identifying signal ×16×18. The output terminal of the NOR circuit NR17 is connected to the gate of an n-channel transistor NT29 constituting the switch S11. It is also connected via an inverter circuit I15 to the gate of a p-channel transistor PT50 constituting switch S11. One end of the current path of transistors NT29 and PT50 constituting the switch S11 is connected to read-write line RWDnS, and the other end is connected to dedicated parity read line RD8.

The input terminal of a NAND circuit ND12 is supplied with the cell array select signals #-1, #-2 and cell array select signal A9CA8C. The output terminal of the NAND circuit ND12 is connected to one input terminal of a NOR circuit NR18. The other input terminal of the NOR circuit NR18 is also supplied with the test signal TEST. The output terminal of the NOR circuit NR18 is connected to the gate of an n-channel transistor NT30 constituting the switch S12. It is also connected via an inverter circuit I16 to the gate of a p-channel transistor PT51 constituting switch S12. One end of the current path of transistors NT30 and PT51 constituting the switch S12 is connected to read-write line BRWDn4, and the other end is connected to dedicated parity read line BRD8.

The input terminal of a NAND circuit ND13 is supplied with the cell array select signals #-1, #-2 and product identifying signal ×16×18. The output terminal of the NAND circuit ND13 is connected via an inverter circuit I17 to the gate of an n-channel transistor NT31 constituting a switch S13. It is also connected to the gate of a p-channel transistor PT52 constituting the switch S13. One end of the current path of transistors NT31 and PT52 constituting the switch S13 is connected to read-write line BRWDn5, and the other end is connected to dedicated parity read line BRD9.

The input terminal of a NAND circuit ND14 is supplied with the cell array select signals #-1, #-2 and cell array select signal BA9CASC. The output terminal of the NAND circuit ND14 is connected to the input terminal of a NOR circuit NR19. The input terminal of the NOR circuit NR19 is also supplied with the test signal TEST and product identifying signal ×16×18. The output terminal of the NOR circuit NR19 is connected to the gate of an n-channel transistor NT32 constituting a switch S14. It is also connected via an inverter circuit I18 to the gate of a p-channel transistor PT53 constituting the switch S14. One end of the current path of transistors NT32 and PT53 constituting the switch S14 is connected to read-write line BRWDn5, and the other end is connected to dedicated parity read line BRD8.

Between the dedicated parity read line RD9 and the first power supply, the current path of a p-channel transistor PT54 is connected. The gate of the p-channel transistor PT54 is supplied with a product identifying signal ×16×18. Between the dedicated parity read line BRD9 and the first power supply, the current path of a p-channel transistor PT55 is connected. The gate of the p-channel transistor PT55 is supplied with a product identifying signal ×16×18.

With the above configuration, when parity cell arrays K16 and K17 are selected, the data items on read-write lines RWDn4, RWDn5, BRWDn4, BRWDn5 are transferred to dedicated parity read lines RDS, RD9, BRDS, and BRD9 via the parity cell data read switch circuit shown in FIG. 12.

For example, with parity cell array K16 being selected, when the product identifying signal ×16×18 is high, the data on read-write lines RWDn4, RWDn5, BRWDn4, and BRWDn5 are transferred to dedicated parity read lines RD8, RD9, BRD8, BRD9 via switches S9, S10, S12, S13. When the product identifying signal ×16×18 is low, any of switches S9, S11, S12, and S14 turns on according to the cell array select signal A9-CA8C (BA9CASC), which allows the data on any of read-write lines RWDn4, RWDn5 (BRWDn4, BRWDn5) to be selected and transferred to dedicated parity read lines RD8, RD9 (BRD8, BRD9).

Next explained will be the write operation. First, an overview will be given.

The data written from an input/output terminal I/O (not shown) is transferred onto data lines via a data write circuit (not shown). Of the data transferred onto the data lines D, the data to be written in an ordinary cell array is transferred to ordinary cell array write data lines WD via the ordinary cell array write switch circuit shown in FIG. 13.

Figure 14:
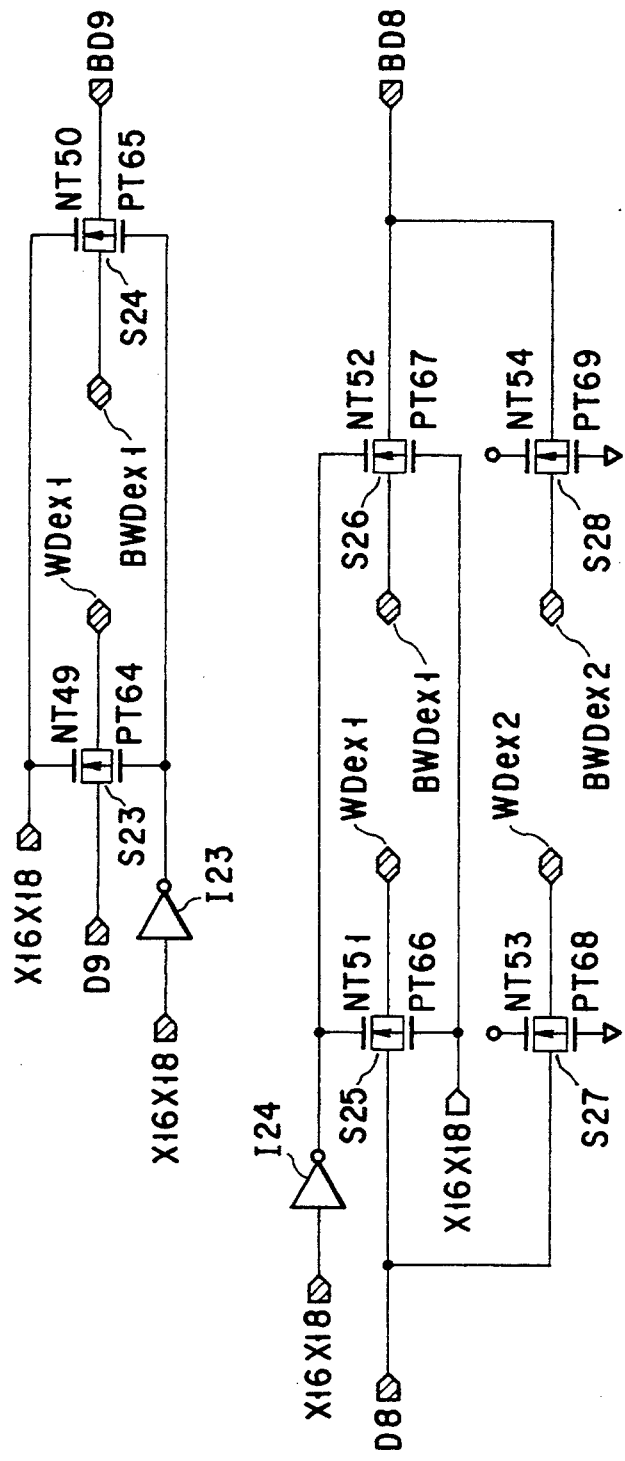
FIG. 14 is a circuit diagram of an example of a parity cell array write switch circuit.

Similarly, the data to be written in a parity cell array is transferred onto the parity cell array write data lines WDexn (n=1, 2) via the parity cell array write switch circuit shown in FIG. 14.

Figure 13:
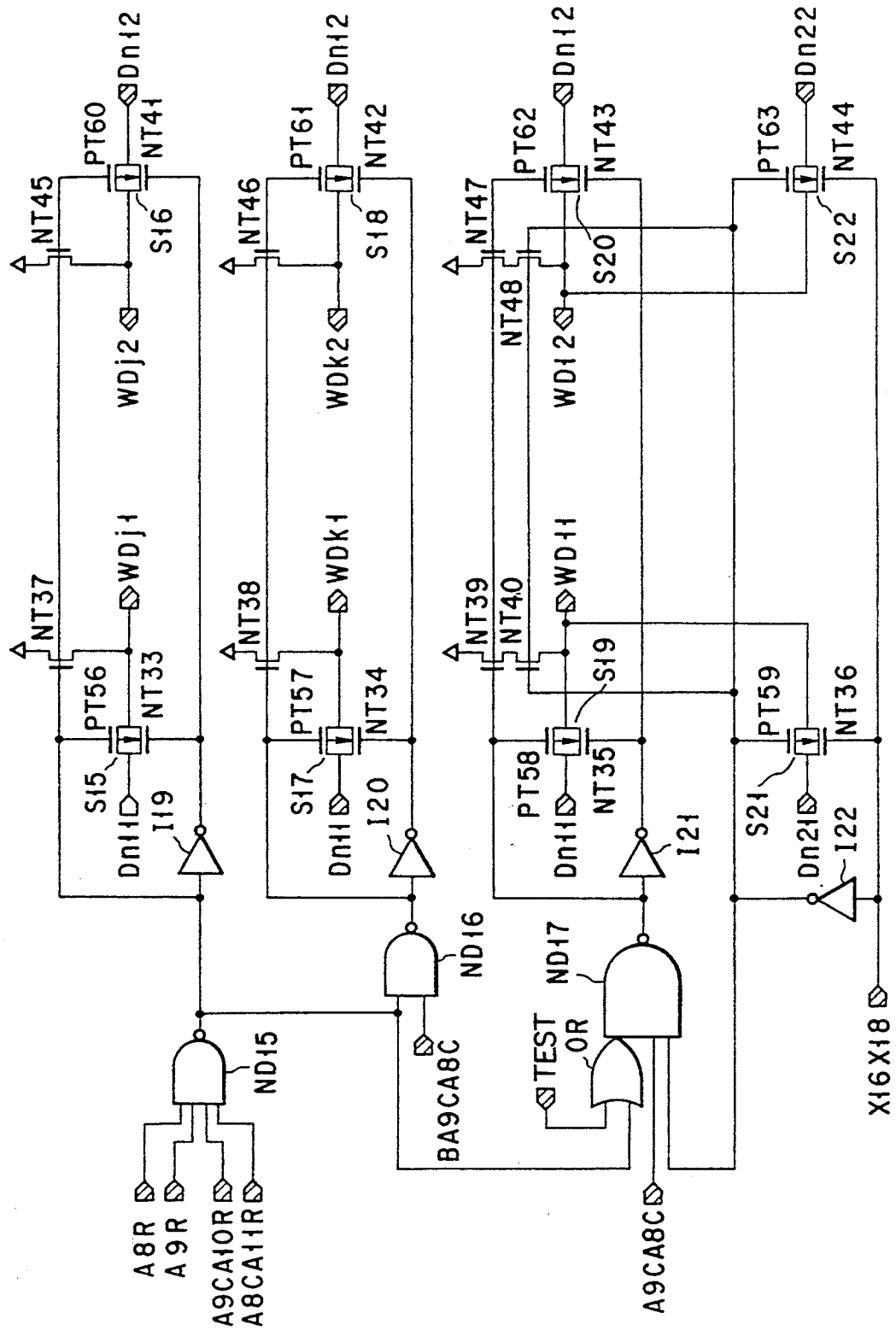
FIG. 13 is a circuit diagram of an example of an ordinary cell array write switch circuit.

In FIGS. 13 and 14, switches S15 through S28 that transfer the data on data lines D to ordinary cell array write data lines WD and parity cell array write data lines WDexn, are on-off controlled by a cell array select signal according to an address and a product identifying signal ×16×18 indicating types of products.

The ordinary cell array write data transferred onto ordinary cell array write data lines WD shown in FIG. 13, is transferred to read-write lines RWDn1, BRWDn1 (l=0 to 5) via the ordinary cell array read-write line write circuit shown in FIG. 15.

Similarly, the parity cell array write data transferred to the parity cell array write data lines WDexn shown in FIG. 14, is transferred to the read-write lines RWDn1, BRWDn1 (l=4, 5) via the parity cell array read-write line write circuit shown in FIG. 16. The data items transferred to read-write lines RWDn and BRWDn1, respectively, are transferred via the data column-line amplifier circuit DQB to data column lines DQn, BDQn, and bit lines. This operation is the opposite of a read operation.

Next, the arrangement of each circuit will be explained.

In an ordinary cell array write circuit shown in FIG. 13, the input terminal of a NAND circuit ND15 is supplied with cell array select signals ASR, A9R, A9-CA10R, and A8CA11R. The output terminal of the NAND circuit ND15 is connected via an inverter circuit I19 to the gates of n-channel transistors NT33 and NT41 constituting switches S15 and S16. It is also connected to the gates of p-channel transistors PT56 and PT60 constituting switches S15 and S16. One end of the current path of transistors NT33 and PT56 constituting a switch S15 is connected to data line Dn11, and the other end is connected to ordinary cell array write data line WDj1. One end of the current path of transistors NT41 and PT60 constituting a switch S16 is connected to data line Dn12, and the other end is connected to ordinary cell array write data line WDj2. Between the ordinary cell array write data line WDj1 and the second power supply, the current path of n-channel transistor NT37 is connected, and between the ordinary cell array write data line WDj2 and the second power supply, the current path of an n-channel transistor NT45 is connected. The gates of these transistors NT37 and NT45 are connected to the output terminal of the NAND circuit ND15.

The input terminal of a NAND circuit ND16 is supplied with the output signal of the NAND circuit ND15 and cell array select signal BA9CA8C. The output terminal of the NAND circuit ND16 is connected via an inverter circuit I20 to the gates of n-channel transistors NT34 and NT42 constituting switches S17 and S18. It is also connected to the gates of p-channel transistors PT57 and PT61 constituting switches S17 and S18. One end of the current path of transistors NTB4 and PT57 constituting the switch S17 is connected to data line Drill, and the other end is connected to ordinary cell array write data line WDk1. One end of the current path of transistors NT42 and PT61 constituting the switch S18 is connected to data line Dn12, and the other end is connected to ordinary cell array write data line WDk2. Between the ordinary cell array write data line WDk1 and the second power supply, the current path of an n-channel transistor NT38 is connected, and between the ordinary cell array write data line WDk2 and the second power supply, the current path of an n-channel transistor NT46 is connected. The gates of these transistors NT38 and NT46 are connected to the output terminal of the NAND circuit ND16.

The input terminal of an OR circuit OR is supplied with a test signal TEST and the output signal of the NAND circuit ND15. The input terminal of a NAND circuit ND17 is supplied with the output signal of the OR circuit OR, a cell array select signal A9CA8C, and a product identifying signal ×16×18 inverted with an inverter circuit I22. The output terminal of the NAND circuit ND17 is connected via an inverter circuit I21 to the gates of n-channel transistors NT35 and NT43 constituting switches S19 and S20. It is also connected to the gates of p-channel transistors PT58 and PT62 constituting switches S19 and S20. One end of the current path of transistors NT35 and PT58 constituting a switch S19 is connected to data line Drill, and the other end is connected to ordinary cell array write data line WD11. One end of the current path of transistors NT43 and PT62 constituting a switch S20 is connected to data line Dn12, and the other end is connected to ordinary cell array write data line WD12. Between the ordinary cell array write data line WD11 and the second power supply, the current paths of n-channel transistors NTB9 and NT40 are connected in series, and between the ordinary cell array write data line WD12 and the second power supply, the current paths of n-channel transistors NT47 and NT48 are connected in series. The gates of these transistors NT39 and NT47 are connected to the output terminal of the NAND circuit ND17 and the gates of the transistors NT40 and NT48 are connected to the output terminal of the inverter circuit I22.

The gates of n-channel transistors NT36 and NT44 constituting switches S21 and S22 are supplied with the product identifying signal ×16×18. The gates of p-channel transistors PT59 and PT63 constituting switches S21 and S22 are supplied with the product identifying signal ×16×18 inverted by an inverter circuit I22. One end of the current path of transistors NT36 and PT59 constituting a switch S21 is connected to data line Dn21, and the other end is connected to ordinary cell array write data line WD11. One end of the current path of transistors NT44 and PT63 constituting a switch S22 is connected to data line Dn22, and the other end is connected to ordinary cell array write data line WD12.

In a parity cell array write switch circuit shown in FIG. 14, the gates of n-channel transistors NT49 and NT50 constituting switches S23 and S24 are supplied with the product identifying signal ×16×18. The gates of p-channel transistors PT64 and PT65 constituting switches S23 and S24 are supplied with the product identifying signal ×16×18 inverted by an inverter circuit I23. One end of the current path of transistors NT49 and PT64 constituting the switch S23 is connected to data line D9, and the other end is connected to parity cell array write data line WDex1. One end of the current path of transistors NT50 and PT65 constituting the switch S24 is connected to data line BD9, and the other end is connected to parity cell array write data line BWDex1.

The gates of n-channel transistors NT51 and NT52 constituting switches S25 and S26 are supplied with the product identifying signal ×16×18 inverted by an inverter circuit I24. The gates of p-channel transistors PT66 and PT67 constituting switches S25 and S26 are supplied with the product identifying signal ×16×18. One end of the current path of transistors NT51 and PT66 constituting the switch S25 is connected to data line DS, and the other end is connected to parity cell array write data line WDex1. One end of the current path of transistors NT52 and PT67 constituting the switch S26 is connected to data line BDS, and the other end is connected to parity cell array write data line BWDex1.

The gates of transistors NT53 and NT54 constituting switches S27 and S28 are supplied with the first power supply. The gates of transistors PT68 and PT69 constituting switches S27 and S28 are supplied with the second power supply. One end of the current path of transistors NT53 and PT68 constituting the switch S27 is connected to data line DS, and the other end is connected to parity cell array write data line WDex2. One end of the current path of transistors NT54 and PT69 constituting the switch S28 is connected to data line BDS, and the other end is connected to parity cell array write data line BWDex2.

An ordinary cell array read-write line write circuit shown in FIG. 15 is connected to ordinary cell array write data lines WDj1 through WD12 and read-write lines RWDn1, BRWDn1 (l=0 to 5) shown in FIG. 13. FIG. 15 shows one circuit as the representative of the rest.

In FIG. 15, ordinary cell array write data lines BWDj, WDj are connected via inverter circuits I25 and I26 to the gates of p-channel transistors PT70 and PT71, respectively. Further, ordinary cell array write data line BWDj is connected to the gate of n-channel transistor NT56, and ordinary cell array write data line WDj is connected to the gate of n-channel transistor NT55. The transistors PT70 and NT55 are connected in series between the first and second power supplies. The junction point of these transistors PT70 and NT55 is connected to read-write BRWDn1 (l=0 to 5). The transistors PT71 and NT56 are connected in series between the first and second power supplies. The junction point of these transistors PT71 and NT56 is connected to read-write RWDn1 (l=0 to 5).

A parity cell array read-write line write circuit shown in FIG. 16 is connected to parity cell array write data lines WDex1, WDex2 and read-write lines RWDn1, BRWDn1 (l=4, 5). FIG. 16 shows parity cell array write data line WDex1 only, with WDex2 not shown here.

In FIG. 16, the input terminal of a NAND circuit ND18 is supplied with cell array select signals #-1, A9CA8C, #-2. The output terminal of the NAND circuit ND18 is connected to one input terminal of each of NAND circuits ND19 and ND20 via an inverter circuit I28. Parity cell array write data lines BWDex1, WDex1 are connected to the other input terminals of these NAND circuits ND19 and ND20. The output terminal of the NAND circuit ND19 is connected to the gate of a p-channel transistor PT72, and the output terminal of the NAND circuit ND20 is connected to the gate of a p-channel transistor PT7B. Further, the output terminal of the NAND circuit ND19 is connected via an inverter circuit I27 to the gate of an n-channel transistor NT58, and the output terminal of the NAND circuit ND20 is connected via an inverter circuit I29 to the gate of an n-channel transistor NT57. The transistors PT72 and NT57 are connected in series between the first and the second power supply, and the junction point of transistors PT72 and NT57 is connected to read-write line BRWDn1 (l=4, 5). The transistors PT73 and NT58 are connected in series between the first and second power supplies, and the junction point of transistors PT73 and 58 is connected to read-write line RWDn1 (l=4, 5).

With the above arrangement, the operation of writing ordinary cell array write data in ordinary cell array K14 will be explained. First, when the product is of ×16 bits or ×18 bits, the product identifying signal ×16×18 goes high and the output signal of the NAND circuit ND15 goes high in the ordinary cell array write switch circuit shown in FIG. 13. For this reason, switches S15, S16, S19, and S20 are placed in the off state and switches S17, S18, S21, and S22 are placed in the on state. Therefore, the data items transferred to data lines Dn11, Dn12, Dn21, Dn22 are transferred to ordinary cell array write data lines WDk1, WD11, WDk2, WD12, respectively. The data transferred to these cell array write data lines WDk1, WD11, WDk2, WD12 are written in read-write lines RWDn1, BRWDn1 (l=0 to 3) via the ordinary cell read-write line write circuit shown in FIG. 15. The data items written in these read-write lines RWDn1, BRWDn1 (l=0 to 3) are transferred to data signal lines DQn and bit lines via data signal-line amplifier circuits DQB placed on both sides of ordinary cell array K14.

Further, when the product is of ×8 bits or ×9 bits, the ordinary cell array write switch circuit shown in FIG. 13, depending on the state of the cell array select signal A9CA8C (BA9CA8C), transfers the data on data lines Dn11, Dn12 to any of ordinary cell array write data lines WDk1 and WD11 and any of WDk2 and WD12. For example, when cell array select signal A9-CA8C is high, the data on data lines Dn11, Dn12 is transferred to ordinary cell array write data lines WD11, WD12. The data items transferred to these ordinary cell array write data lines WD11, WD12 are transferred to data signal lines DQn and bit lines via read-write lines RWDnl, BRWDnl (l=0 to 3) and the data signal-line amplifier circuit DQB.

Next explained will be how ordinary cell array write data is written in ordinary cell array K15. First, when the product is of ×16 bits or ×18 bits, the product identifying signal ×16×18 goes high and the output signal of the NAND circuit ND15 goes low in the ordinary cell array write switch circuit shown in FIG. 13. For this reason, the data items transferred to data lines Dn11, Dn12, Dn21, Dn22 are transferred to ordinary cell array write data lines WDj1, WD11, WDj2, WD12, respectively. These data items are written in read-write lines RWDnl, BRWDnl (l=1, 3, 4, 5) via the ordinary cell read-write line write circuit shown in FIG. 15. The data items written in these read-write lines RWDnl, BRWDnl (l=1, 3, 4, 5) are transferred to data column lines DQn and bit lines via data signal-line amplifier circuits DQB placed on both sides of ordinary cell array K15.

Further, when the product is of ×8 bits or ×9 bits, and writing data in area number P=15 is selected, the output signal of the NAND circuit ND15 is kept high and the cell array select signal A9CASC is also kept high in the ordinary cell array write switch circuit shown in FIG. 13. Thus, the data items on data lines Dn11, Dn12 are transferred to ordinary cell array write data lines WD11, WD12. These data items are written in read-write lines RWDnl, BRWDnl (l=1, 3) via the ordinary cell array read-write line write circuit shown in FIG. 15. The data items written in these read-write lines RWDnl, BRWDnl (l=1, 3) are transferred to data signal lines DQn and bit lines via the data signal-line amplifier circuit DQB located at cell array interval P=15.

Further, when the product is of ×8 bits or ×9 bits, and writing data in area number P=16 is selected, the output signal of the NAND circuit ND15 goes low in the ordinary cell array write switch circuit shown in FIG. 13. Thus, the data items on data lines Dn11, Dn12 are transferred to ordinary cell array write data lines WDj1, WDj2. These data items are written in read-write lines RWDnl, BRWDnl (l=4, 5) via the ordinary cell array read-write line write circuit shown in FIG. 15. The data items written in these read-write lines RWDnl, BRWDnl (l=4, 5) are transferred to data signal lines DQn and bit lines via the data signal-line amplifier circuit DQB located at cell array interval P=16.

Next explained will be how parity cell array write data is written in parity cell array K16. First, when the product is of ×16 bits or ×18 bits, the product identifying signal ×16×18 is high in the parity cell array write switch circuit shown in FIG. 14, with the result that the parity cell array write data items are transferred via data lines D8, D9 (BD8, BD9) to parity cell array write data lines WDex2, WDex1 (BWDex2, BWDex1). These data items are written in read-write lines RWDnl, BRWDnl (l=4, 5) via the parity cell array read-write line write circuit shown in FIG. 16. The data items written in these read-write lines RWDnl, BRWDnl (l=4, 5) are transferred to data signal lines DQn and bit lines via the data signal-line amplifier circuit DQB placed on either area number P=16 or P=17 selected according to the address.

Further, when the product is ×8 bits or ×9 bits, the product identifying signal ×16×18 is low in the parity cell array write switch circuit shown in FIG. 14, with the result that the data on data line D8 is transferred to parity cell array write data lines WDex2, WDex1 (BWDex2, BWDex1). Because one of four data signal-line amplifier circuits located at area numbers P=16 and P=17 is selected according to the address, the data transferred to the parity cell array write data lines WDex2, WDex1 (BWDex2, BWDex1) is written in read-write lines RWDnl, BRWDnl (l=4, 5) via the parity cell array read-write line write circuit shown in FIG. 16. For example, when the data column-line amplifier circuit DQB connected to read-write line RWD15 (BRWD15) at area number P=16 is selected, the cell array select signal A9CA8C of the parity cell array read-write line write circuit shown in FIG. 16 goes high, with the result that the data on parity cell array write data line WDex1 is written in read-write line RWDn5 (BRWDn5). When the cell array select signal A9CASC of the parity cell array read-write line write circuit shown in FIG. 16 goes low, with the result that the data on parity cell array write data line WDex2 is transferred to read-write line RWDn4 (BRWDn4). This transferred data is transferred to data signal lines DQn and bit lines via the corresponding data signal-line amplifier circuit DQB.

Figure 17:
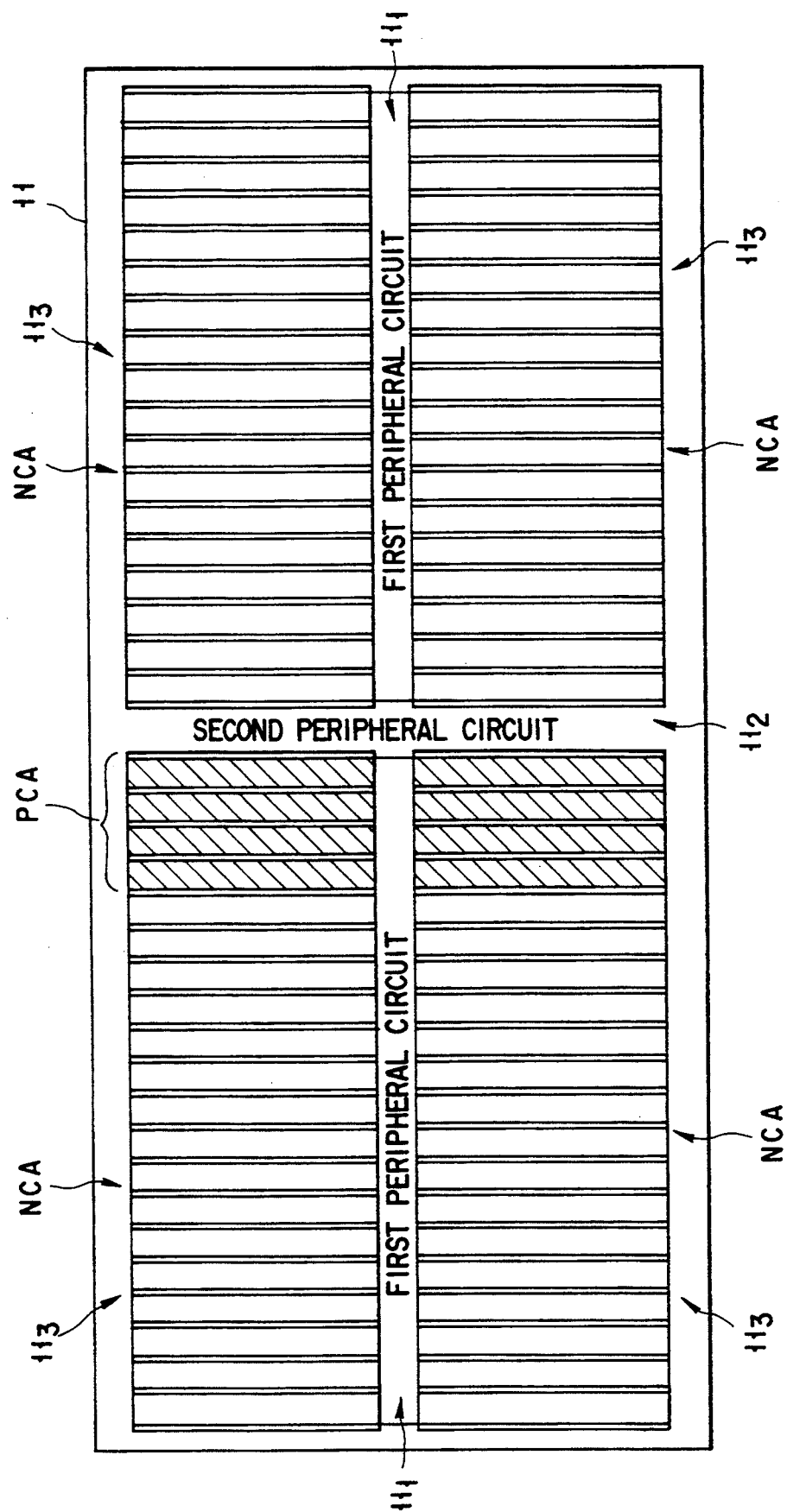
FIG. 17 is a plan view of the arrangement of parity cell arrays according to another embodiment of the present invention.
Figure 18:
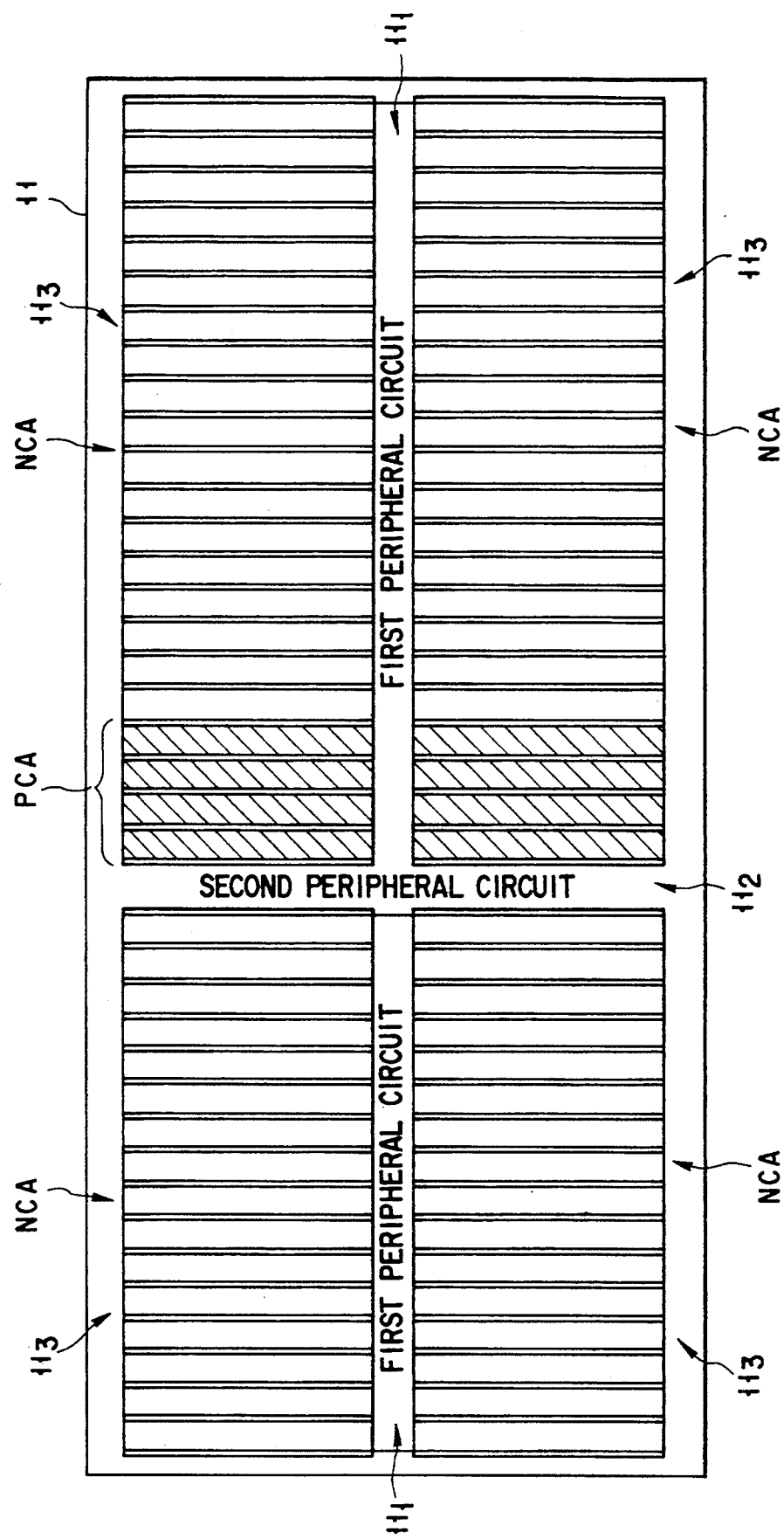
FIG. 18 is a plan view of the arrangement of parity cell arrays according to still another embodiment of the present invention.

While in the above embodiment, parity cell arrays are placed on both sides of the second peripheral circuit 11 2 equally, they may be placed in other ways. For example, as shown in FIGS. 17 and 18, placing parity cell arrays on either the right side or the left side of the second peripheral circuit 112 provides a similar effect to that described above.

Next explained will be how to refresh the ordinary cell arrays NCA and the parity cell arrays PCA. To simplify explanation, it is assumed that the number of cell arrays is not a multiple of 9.

Figure 19:
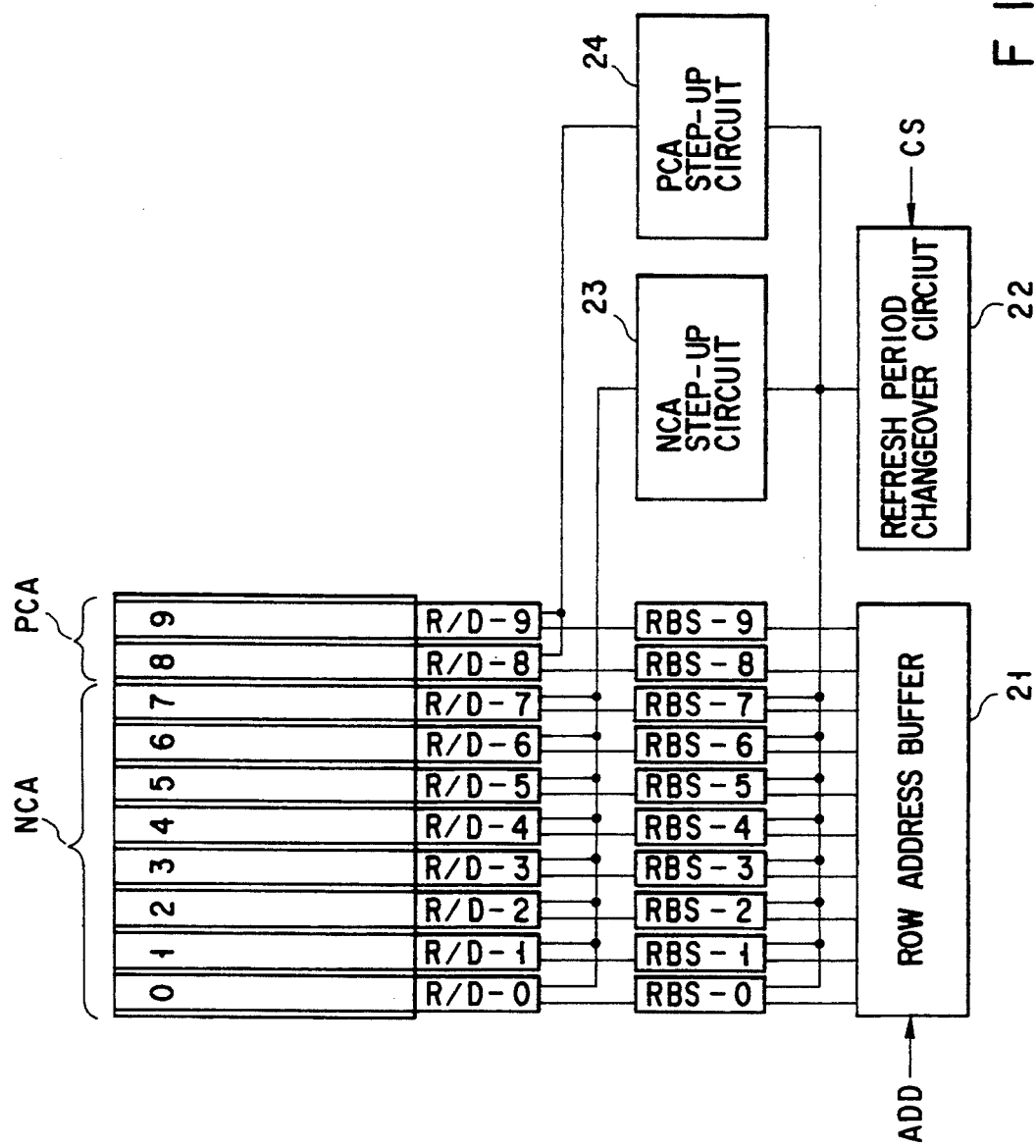
FIG. 19 is a schematic diagram of a refresh circuit composed of ordinary cell arrays and parity cell arrays according to a first embodiment of the present invention.

FIG. 19 shows a first embodiment of a refresh circuit, where there are 8 ordinary cell arrays NCA and two parity cell arrays. In FIG. 19, row block selectors RBS-0 through RBS-9 are connected to a row address buffer 21 that retains row addresses. Row decoders R/D-0 through R/D-9 are connected to these row block selectors RBS-0 through RBS-9. These row decoders R/D-0 through R/D-9 are connected to ordinary cell arrays NCA and parity cell arrays PCA.

A refresh-period changeover circuit 22 changes refresh periods according to a control signal CS and, in the self-refresh mode, is set to a specified refresh period. The refresh-period changeover circuit 22, which is composed of, for example, a logic circuit, generates three changeover signals for changing refresh periods according to the control signal CS. With the changeover signal, the ordinary cell arrays are divided into 8, 4, or 2 subdivisions for refreshing. For example, the ordinary cell array NCA is divided into 8 subdivisions for refreshing, only the change over signal corresponding to ⅛ is made high and the changeover signals corresponding to ¼ and ½ are made low.

The output terminal of the refresh period changeover circuit 22 is connected to the row block selectors RBS-0 through RBS-7 corresponding to the ordinary cell arrays NCA. It is also connected to an NCA step-up circuit 23 for raising the potential of the words lines of the ordinary cell arrays and a PCA step-up circuit 24 for raising the potential of the words lines of the parity cell arrays. The row block selectors, which are made up of logic circuits (not shown), select at least one row decoder according to the output signal of the row address buffer and the three changeover signals from the refresh period changeover circuit 22. The NCA step-up circuit 2B is connected to the row decoders R/D-0 through R/D-7 connected to the ordinary cell arrays NCA. The PCA step-up circuit 24 is connected to the row decoders R/D-8 and R/D-9 connected to the parity cell arrays PCA.

With the above configuration, for a refresh operation, one of the two parity cell arrays PCA is selected by the PCA step-up circuit 24, and the voltage of a single word line in the selected parity cell array is raised.

In the case of the ordinary cell arrays NCA, 8 ordinary cell arrays NCA are divided into 8, 4, or 2 subdivisions for selection according to the changeover signals from the refresh-period changeover circuit 22. For example, when the ordinary cell arrays NCA are divided into 8 subdivisions for selection, only the changeover signal corresponding to $\frac{1}{8}$ is made high, and the changeover signals corresponding to $\frac{1}{4}$ and $\frac{1}{2}$ are made low. The row block selectors select one row decoder according to these changeover signals and the row address signal supplied from the row address buffer 21. This selected row decoder selects one word line in the cell array and the voltage of the selected word line is raised by the NCA step-up circuit 23.

When the ordinary cell arrays NCA are divided into 4 subdivisions for selection, only the changeover signal corresponding to $\frac{1}{4}$ is made high, and the changeover signals corresponding to $\frac{1}{8}$ and $\frac{1}{2}$ are made low. The row block selectors select two row decoders according to these changeover signals and the row address signal. These selected row decoders select one word line in each cell array and the voltages of a total of two selected word lines are raised by the NCA step-up circuit 23.

Similarly, when the ordinary cell arrays NCA are divided into 2 subdivisions for selection, four row decoders are selected according to the changeover signals and row address signal. A total of 4 word lines are raised in voltage by the NCA step-up circuit 23.

In this way, by changing the refresh period, the number of word lines selected changes. For this reason, the NCA step-up circuit 23 changes the capacity of the step-up capacitor according to the changeover signal so that the step-up level of the word line may be constant even if the refresh period changes.

In the first embodiment of the refresh circuit, although when $\frac{1}{8}$ and $\frac{1}{4}$ are selected for the refresh period, the refresh period of the ordinary cell arrays NCA differs from that of the parity cell arrays PCA, when $\frac{1}{2}$ is selected, the refresh period of the ordinary cell arrays NCA agrees with that of the parity cell arrays PCA.

Figure 20:
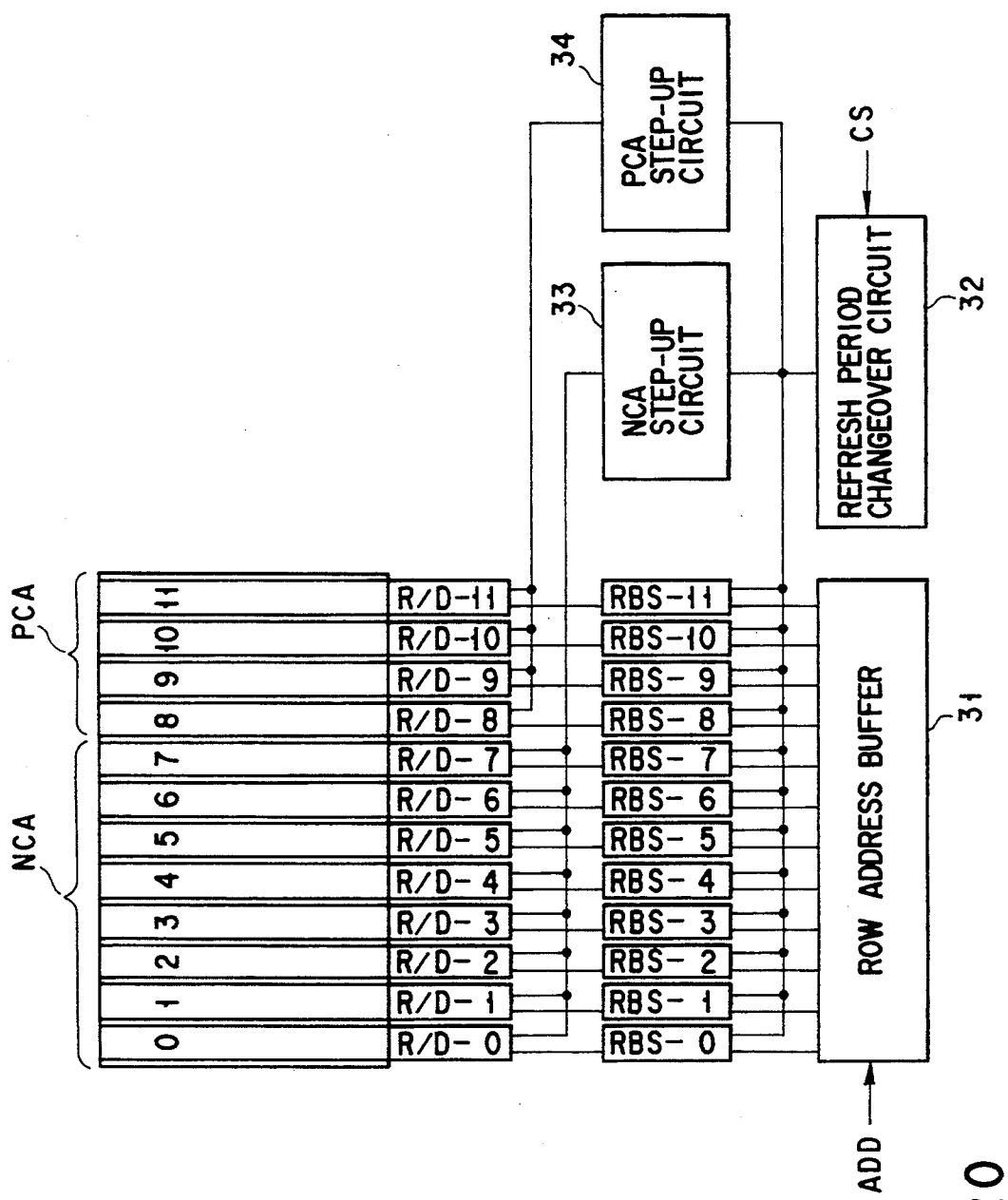
FIG. 20 is a schematic diagram of a refresh circuit composed of ordinary cell arrays and parity cell arrays according to a second embodiment of the present invention.
Figure 22:
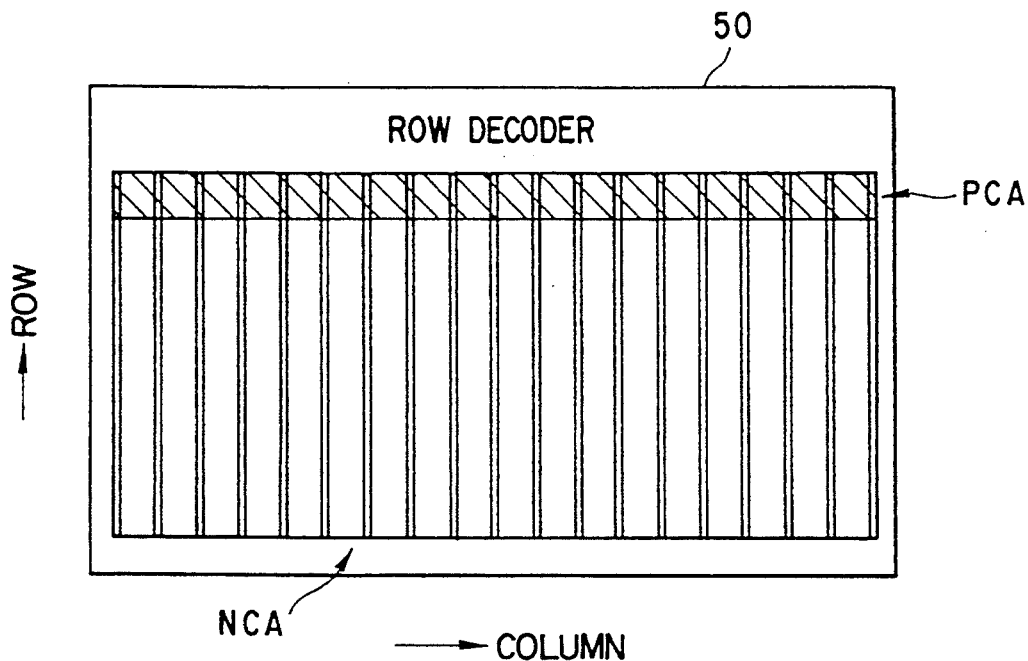
FIG. 22 is a plan view of a conventional chip layout.
Figure 23:
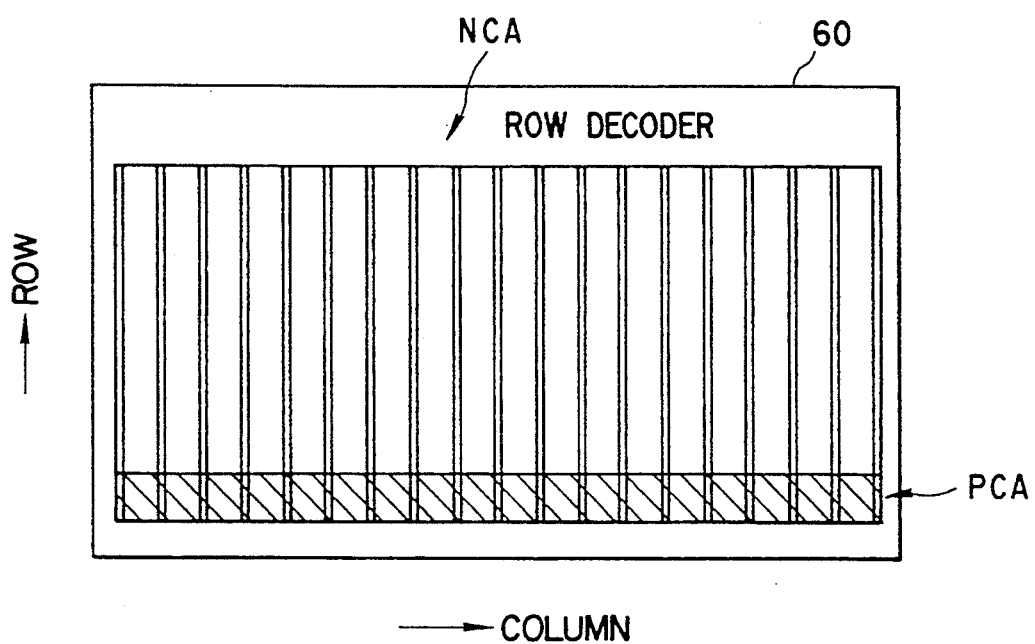
FIG. 23 is a plan view of a conventional chip layout.
Figure 24:
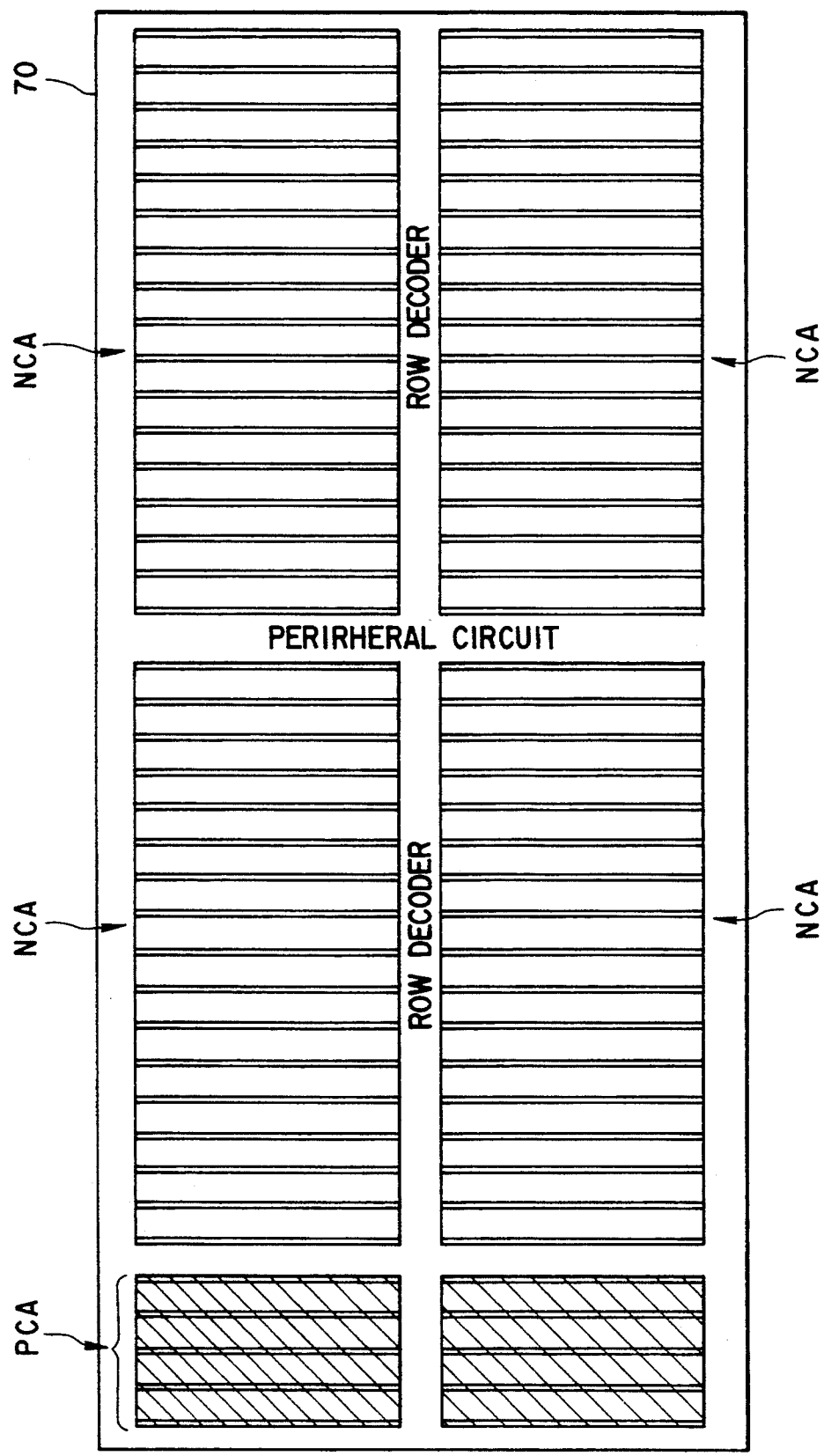
FIG. 24 is a plan view of a conventional chip layout.

FIG. 20 shows a second embodiment of the refresh circuit, where there are 8 ordinary cell arrays NCA and 4 parity cell arrays PCA. In FIG. 20, row block selectors RBS-0 through RBS-11 are connected to a row address buffer 31 that retains row addresses. Row decoders R/D-0 through R/D-11 are connected to these row block selectors RBS-0 through RBS-11. These row decoders R/D-0 through R/D-11 are connected to ordinary cell arrays NCA and parity cell arrays PCA.

A refresh period changeover circuit 32, like that in the first embodiment, outputs three changeover signals according to a control signal CS. The output terminal of the refresh-period changeover circuit 32 is connected to the row block selectors RBS-0 through RBS-11. It is also connected to an NCA step-up circuit 33 for raising the potential of the words lines of the ordinary cell arrays and to a PCA step-up circuit 34 for raising the potential of the words lines of the parity cell arrays. The NCA step-up circuit 33 is connected to the row decoders R/D-0 through R/D-7 connected to the ordinary cell arrays NCA. The PCA step-up circuit 34 is connected to the row decoders R/D-8 through R/D-11 connected to the parity cell arrays PCA.

With the above configuration, 8 ordinary cell arrays NCA are divided into 8, 4, or 2 subdivisions for selection according to the changeover signals from the refresh period changeover circuit 32, and 4 parity cell arrays PCA are divided into 4 or 2 subdivisions for selection according to the changeover signals. For example, when the ordinary cell arrays NCA are divided into 8 subdivisions for selection, and the parity cell arrays PCA are divided into 4 subdivisions, the row block selectors select one row decoder from each group of the ordinary cell arrays NCA and parity cell arrays PCA according to the changeover signals and the row address signal. These selected row decoders select one word line in each group of the cell arrays and the voltages of the selected word lines are raised by the NCA step-up circuit 33 and PCA step-up circuit 34.

When the ordinary cell arrays NCA and parity cell arrays PCA are both divided into 4 subdivisions for selection, the row block selectors select two row decoders corresponding to ordinary cell arrays NCA and a single row decoder corresponding to a parity cell array PCA according to the changeover signals and the row address signal. One word line in each of the cell arrays selected by these row decoders, that is, three word lines in total, are raised in voltage by the NCA step-up circuit 33 and PCA step-up circuit 34.

Similarly, when the ordinary cell arrays NCA and parity cell arrays PCA are divided into 2 subdivisions for selection, six row decoders are selected according to the changeover signals and the row address signal. Then, one word line in each of the cell arrays selected by these row decoders, that is, six word lines in total, are raised in voltage by the NCA step-up circuit 33 and PCA step-up circuit 34.

In this way, by changing the refresh period, the number of word lines selected changes. For this reason, the NCA step-up circuit 33 changes the value of the step-up capacity according to the changeover signals so that the step-up level of the word line may be constant even if the refresh period changes.

In the above embodiment, although when $\frac{1}{8}$ is selected for the refresh period, the refresh period of the ordinary cell arrays NCA differs from that of the parity cell arrays PCA, when $\frac{1}{2}$ and $\frac{1}{4}$ are selected, the refresh period of the ordinary cell arrays NCA agrees with that of the parity cell arrays PCA.

FIG. 21 shows a third embodiment of the refresh circuit, where there are 8 ordinary cell arrays NCA and 8 parity cell arrays PCA. In FIG. 21, row block selectors RBS-0 through RBS-15 are connected to a row address buffer 41 that retains row addresses. Row decoders R/D-0 through R/D-15 are connected to these row block selectors RBS-0 through RBS-15. These row decoders R/D-0 through R/D-15 are connected to ordinary cell arrays NCA and parity cell arrays PCA.

A refresh period changeover circuit 42, like that in the first embodiment, outputs three changeover signals according to a control signal CS. The output terminal of the refresh period changeover circuit 42 is connected to the row block selectors RBS-0 through RBS-15. It is also connected to an NCA step-up circuit 43 for raising the potential of the words lines of the ordinary cell arrays and a PCA step-up circuit 44 for raising the potential of the words lines of the parity cell arrays. The NCA step-up circuit 43 is connected to the row decoders R/D-0 through R/D-7 connected to the ordinary cell arrays NCA. The PCA step-up circuit 44 is connected to the row decoders R/D-8 through R/D-15 connected to the parity cell arrays PCA.

With the above configuration, the ordinary cell arrays NCA and parity cell arrays PCA are both divided into 8, 4, or 2 subdivisions for selection according to the changeover signals from the refresh-period changeover circuit 32. In this embodiment, the refresh period of the ordinary cell arrays NCA agrees with that of the parity cell array PCA. For example, when the ordinary cell arrays NCA and parity cell arrays are both divided into 8 subdivisions for selection, one row decoder is selected for each group of the ordinary cell arrays NCA and parity cell arrays PCA according to the changeover signals and the row address signal. One word line in each group of the cell arrays selected by these row decoders is raised in voltage by the NCA step-up circuit 43 and PCA step-up circuit 44.

When the ordinary cell arrays NCA and parity cell array PCA are both divided into 4 subdivisions for selection, four row decoders are selected by the refresh-period changeover circuit 42 and the row address. One word line in each of the cell arrays selected by these row decoders, that is, four word lines in total, are raised in voltage by the NCA step-up circuit 43 and PCA step-up circuit 44.

Similarly, when the ordinary cell arrays NCA and parity cell arrays PCA are divided into 2 subdivisions for selection, 8 row decoders are selected according to the changeover signals and the row address signal. Then, one word line in each of the cell arrays selected by these row decoders, that is, 8 word lines in total, are raised in voltage by the NCA step-up circuit 43 and PCA step-up circuit 44.

In this way, by changing the refresh period, the number of word lines selected changes. For this reason, the NCA step-up circuit 43 and PCA step-up circuit 44 change the value of the step-up capacity according to the changeover signals so that the step-up level of the word line may be constant even if the refresh period changes.

As described above, by providing the ordinary cell arrays NCA and the parity cell arrays PCA with an NCA step-up circuit and a PCA step-up circuit, respectively, the parity cell arrays PCA can be eliminated and a ×9-bit or ×18-bit structure or a ×8-bit or ×16-bit structure can be achieved, thereby enabling various types of products to be designed efficiently.

Further, by making the refresh period of the ordinary cell arrays NCA different from that of the parity cell arrays PCA, the drawn current in the semiconductor memory device can be reduced in the active operation. Still further, by making the refresh period of the ordinary cell arrays NCA equal to that of the parity cell arrays PCA, the number of so-called self-refreshing operations during retaining data can be reduced, thereby decreasing the drawn current.

This invention may be practiced or embodied in still other ways without departing from the spirit or essential character thereof.

What is claimed is:

1. A semiconductor memory device, comprising:
   memory cell array blocks arranged in rows and columns and each containing a plurality of memory cell arrays, said memory cell array blocks including first and second memory cell array blocks disposed in a first column and third and fourth memory cell array blocks disposed in a second column adjacent to said first column;
   a first peripheral circuit including a row decoder and being arranged between said first and third memory cell array blocks and between said second and fourth memory cell array blocks, said first peripheral circuit being connected to said first, second, third, and fourth memory cell array blocks;
   a second peripheral circuit including a column decoder and being arranged between said first and second memory cell array block and between said third and fourth memory cell array blocks, said second peripheral circuit being connected to said first, second, third, and fourth memory cell array blocks,
   wherein at least one of said first, second, third, and fourth memory cell array blocks includes parity cell arrays and ordinary cell arrays, the parity cell arrays of said at least one memory cell block array being arranged between the ordinary cell arrays of the said at least one memory cell array block and said second peripheral circuit.

2. A semiconductor memory device according to claim 1, further comprising dam read-write circuits connected to said ordinary cell arrays and said parity cell arrays, each of said read-write circuits having the same construction.

3. A semiconductor memory device according to claim 1, wherein said first and second peripheral circuits are shared by adjacent cell array blocks.

4. A semiconductor memory device according to claim 1, further comprising select means arranged on both sides of each of said ordinary cell arrays and said parity cell arrays for selecting said ordinary cell arrays and said parity cell arrays in accordance with an address signal.

5. A semiconductor memory device according to claim 1, further comprising:
   bit lines provided for said ordinary cell arrays and said parity cell arrays and connected to each of said memory cells;
   first data signal lines and first transistors provided between said ordinary cell arrays, said first transistors connecting the bit lines of said ordinary cell arrays to said first data signal lines, and said first data signal lines receiving the data read from the bit lines of said ordinary cell arrays and transferring data to the bit lines;
   first read-write lines for transferring data;
   second read-write lines for transferring data;
   first data signal-line control means provided between said first data signal lines and said first read-write lines, which controls dam transfer from said first data signal lines to said first read-write lines, and data transfer from said first read-write lines to said first data signal lines;
   second data signal lines and second transistors provided between said ordinary cell arrays and said parity cell arrays, said second transistors connecting the bit lines of said ordinary cell arrays to said second data signal lines, and the bit lines of said parity cell arrays to said second data signal lines;
   second data signal-line control means provided between said second data signal lines and said second read-write lines, which controls dam transfer from said second data signal lines to said second read-write lines, and data transfer from said second read-write lines to said second data signal lines;

third data signal lines and third transistors provided between said parity cell arrays, said third transistors connecting the bit lines of said parity cell arrays to said third data signal lines; and third data signal-line control means provided between said third data signal lines and said second read-write lines, which controls data transfer from said third dam signal lines to said second read-write lines, and data transfer from said second read-write lines to said third data signal lines.

6. A semiconductor memory device according to claim 5, wherein said ordinary cell arrays have first read-write circuits and said parity cell arrays have second read-write circuits, said first read-write circuits being connected to said first read-write lines, said second read-write circuits being connected to said second read-write lines, and only when said second data column-line control means provided between said ordinary cell arrays and said parity cell arrays is driven and said ordinary cell arrays are selected, said ordinary cell arrays being connected to said second read-write lines.

7. A semiconductor memory device according to claim 1, further comprising:

first word-line driving circuits connected to said ordinary cell arrays, the first word-line driving circuits driving the word lines contained in said ordinary cell arrays;

second word-line driving circuits connected to said parity cell arrays, the second word-line driving circuits driving the word lines contained in said parity cell arrays; and changeover means connected to at least said first word-line driving circuits, which changes the refresh periods of said ordinary cell arrays and said parity cell arrays.

8. A semiconductor memory device according to claim 7, further comprising:

first supply means connected to said first word-line driving circuits, which supplies a voltage to said first word-line driving circuits according to the output signal of said changeover means; and second supply means connected to said second word-line driving circuits, which supplies a voltage to said second word-line driving circuits according to the output signal of said changeover means.

9. A semiconductor memory device according to claim 8, wherein only two cell array blocks adjacent to said second peripheral circuit of said first through fourth cell array blocks have parity cell arrays, the parity cell arrays being placed between said ordinary cell arrays and said second peripheral circuit.

10. A semiconductor memory device comprising:

a first through a fourth cell array block placed next to each other on a semiconductor substrate, the first through fourth cell array blocks each having ordinary cell arrays and dedicated parity cell arrays, and said ordinary cell arrays and said parity cell arrays containing memory cells arranged in matrix form;

a first peripheral circuit containing a row decoder, the first peripheral circuit being placed between the first and second cell array blocks and between the third and fourth cell array blocks, and being connected to these first through fourth cell array blocks;

a second peripheral circuit containing a column decoder, the second peripheral circuit being placed between the first and third cell array blocks and between the second and fourth cell array blocks, and being connected to these first through fourth cell array blocks;

first wires located between said ordinary cell arrays;

first connecting means for connecting said first wires to said ordinary cell arrays according to the signal from said column decoder;

second wires located between said ordinary cell array and said parity cell array;

second connecting means for connecting said second wires to said ordinary cell array, and to said parity cell array according to the signal from said column decoder;

third wires located between said parity cell arrays;

third connecting means for connecting said parity cell array to second wires according to the signal from said column decoder;

first and second read-write lines for transferring data;

fourth connecting means, located between the first wires and said first read-write lines, for connecting the first wires to said first read-write lines;

fifth connecting means, located between the second wires and said second read-write lines, for connecting the second wires to said second read-write lines;

sixth connecting means, located between the third wires and said second read-write lines, for connecting the third wires to said second read-write lines; and activating means, connected to each of said fourth through sixth connecting means, for activating each of said fourth through sixth connecting means in writing and reading data.

11. A semiconductor memory device comprising:

cell array blocks having ordinary cell arrays and dedicated parity cell arrays, said ordinary cell arrays and said parity cell arrays each containing memory cells arranged in matrix form;

first word-line driving circuits connected to said ordinary cell arrays, the first word-line driving circuits driving the word lines contained in the ordinary cell arrays;

second word-line driving circuits connected to said parity cell arrays, the second word-line driving circuits driving the word lines contained in the parity cell arrays;

changeover means connected to at least said first word-line driving circuits, which changes the refresh periods of the ordinary cell arrays and the parity cell arrays;

first supply means connected to said first word-line driving circuits, which supplies a voltage to said first word-line driving circuits according to the output of said changeover means; and second supply means connected to said second word-line driving circuits, which supplies a voltage to said second word-line driving circuits according to the output of said changeover means.

12. The semiconductor memory device according to claim 1, wherein a total number of the ordinary cell arrays and the parity cell arrays is a multiple of the number 9.

13. The semiconductor memory device according to claim 1, further comprising:

third peripheral circuits arranged around the periphery of said first, second, third, and fourth memory cell army blocks.

14. The semiconductor memory device according to claim 13, wherein each third peripheral circuit includes:
a data signal line amplifier circuit; and
a data signal line control circuit for controlling said data signal line amplifier circuit.

15. The semiconductor memory device according to claim 1, wherein each memory cell array block further comprises bit line pairs connected to said memory cells and said semiconductor memory device further comprises:
data signal line pairs;
switches response to selection signals for selectively connecting said bit line pairs to said data signal line pairs;
data signal line amplifier circuits respectively connected to a corresponding one of said data signal line pairs;
read-write data line pain;
data signal line control circuits connected to said data signal line amplifier circuits for selectively connecting said data signal line pairs to said read-write data line pairs during read or write operations.

16. A semiconductor memory device, comprising:
memory cell array blocks arranged in rows and columns and each containing a plurality of memory cell arrays each having memory cells arranged at intersections of word lines extending in the row direction and bit lines extending the column direction, said memory cell array blocks including first and second memory cell array blocks disposed in a first column of memory cell army blocks and third and fourth memory cell army blocks disposed in a second column of memory cell array blocks adjacent to said first column of memory cell array blocks;
a first peripheral circuit including a row decoder for selecting said word lines and which is arranged between said first and third memory cell array blocks and between said second and fourth memory cell array blocks;
a second peripheral circuit including a column decoder which is arranged between said first and second memory cell array blocks and between said third and fourth memory cell array blocks,
wherein at least one of said first, second, third, and fourth memory cell army blocks includes parity cell arrays and ordinary cell arrays, the parity cell arrays of said at least one memory cell block army being arranged between the ordinary cell arrays of the said at least one memory cell block array and said second peripheral circuit.

17. The semiconductor memory device according to claim 16, wherein each memory cell block array has eighteen memory cell arrays and each memory cell array is a 256 kbit memory cell array.

18. The semiconductor memory device according to claim 16, further comprising:
data signal lines extending in the row direction;
switching transistors respectively connected between said data signal lines and said bit lines; and
column lines connected to said column decoder and extending in the column direction for supplying signals to gates of said switching transistors to transfer data between said data signal lines and said bit lines.

19. The semiconductor memory device according to claim 18, further comprising:
read-write lines;
data signal line amplifier circuits connected between said data signal lines and said read-write lines; and
data signal line amplifier control circuits for controlling said data signal line amplifier circuits to transfer data between said read-write lines and said data signal lines.

20. A semiconductor memory device, comprising:
memory cell arrays each having memory cells arranged at intersections of word lines and bit lines, said memory cell arrays including ordinary cell arrays and parity cell arrays;
first word line driving circuits for driving the word lines connected to memory cells in said ordinary cell arrays;
second word line driving circuits for driving the word lines connected to memory cells in said parity cell arrays;
a refresh period changeover circuit for selectively changing the refresh period of at least said ordinary cell arrays;
a first voltage supply circuit for supplying a voltage to said first word line driving circuits in accordance with an output signal of said refresh period changeover circuit; and
a second voltage supply circuit for supplying a voltage to said second word line driving circuits in accordance with the output signal of said refresh period changeover circuit.

21. The semiconductor memory device according to claim 20, wherein said ordinary cell arrays are divisible into eight, four, or two subdivisions in which one, two, or four word lines, respectively, are selected in accordance with the output signal of said refresh period changeover circuit.

22. The semiconductor memory device according to claim 20, wherein said ordinary cell arrays are divisible into eight, four, or two subdivisions in which one, two, or four word lines, respectively, are selected in accordance with the output signal of said refresh period changeover circuit and wherein said parity cell arrays are divisible into four or two subdivisions in which one or two word lines, respectively, are selected in accordance with the output signal of said refresh period changeover circuit.

23. The semiconductor memory device according to claim 20, wherein said ordinary cell arrays are divisible into eight, four, or two subdivisions in which one, two, or four word lines, respectively, are selected in accordance with the output signal of said refresh period changeover circuit and wherein said parity cell arrays are divisible into eight, four, or two subdivisions in which one, two, or four word lines, respectively, are selected in accordance with the output signal of said refresh period changeover circuit.

24. The semiconductor memory device according to claim 20, wherein said refresh period changeover circuit selectively changes the refresh period of both said ordinary cell arrays and said parity cell arrays.

25. A semiconductor memory device, comprising:
memory cell array blocks arranged in rows and columns and each containing a plurality of memory cell arrays, said memory cell array blocks including first and second memory cell array blocks disposed in a first column and third and fourth memory cell array blocks disposed in a second column adjacent to said first column;

a first peripheral circuit including a row decoder and being arranged between said first and third memory cell array blocks and between said second and fourth memory cell array blocks, said first peripheral circuit being connected to said first, second, third, and fourth memory cell array blocks;

a second peripheral circuit including a column decoder and being arranged between said first and second memory cell array blocks and between said third and fourth memory cell array blocks, said second peripheral circuit being connected to said first, second, third, and fourth memory cell array blocks, wherein at least one of said first, second, third, and fourth memory cell array blocks includes parity cell arrays and ordinary cell arrays, the parity cell arrays of said at least one memory cell block array being arranged between the ordinary cell arrays of the said at least one memory cell array block and said second peripheral circuit, wherein a total number of the ordinary cell arrays and the parity cell arrays is a multiple of the number 9.

26. A semiconductor memory device, comprising:

memory cell array blocks arranged in rows and columns and each containing a plurality of memory cell arrays each having memory cells arranged at intersections of word lines extending in the row direction and bit lines extending in the column direction, said memory cell array blocks including first and second memory cell army blocks disposed in a first column and third and fourth memory cell array blocks disposed in a second column adjacent to said first column;

a first peripheral circuit including a row decoder and being arranged between said first and third memory cell array blocks and between said second and fourth memory cell array blocks, said first peripheral circuit being connected to said first, second, third, and fourth memory cell array blocks;

a second peripheral circuit including a column decoder and being arranged between said first and second memory cell array blocks and between said third and fourth memory cell array blocks, said second peripheral circuit being connected to said first, second, third, and fourth memory cell array blocks, wherein at least one of said first, second, third, and fourth memory cell array blocks includes parity cell arrays and ordinary cell arrays controlled by common control signals, the parity cell arrays of said at least one memory cell block array being arranged along the column direction such that parity cells of said parity cell arrays and ordinary cells of said ordinary cell arrays are selected by different ones of said word lines, and a total number of parity cell arrays and ordinary cell arrays is a multiple of the number 9.

* * * * *